(12) United States Patent
Baccini et al.

(10) Patent No.: US 8,215,473 B2
(45) Date of Patent: Jul. 10, 2012

(54) NEXT GENERATION SCREEN PRINTING SYSTEM

(75) Inventors: Andrea Baccini, Treviso (IT); Marco Galiazzo, Padova (IT); Daniele Andreola, Povegliano (IT); Luigi De Santi, Spresiano (IT); Christian Zorzi, Treviso (IT); Tommaso Vercesi, Treviso (IT)

(73) Assignee: Applied Materials, Inc., Santa Clara, CA (US)

( * ) Notice: Subject to any disclaimer, the term of this patent is extended or adjusted under 35 U.S.C. 154(b) by 560 days.

(21) Appl. No.: 12/418,912

(22) Filed: Apr. 6, 2009

(65) Prior Publication Data

US 2009/0305441 A1 Dec. 10, 2009

Related U.S. Application Data

(60) Provisional application No. 61/102,310, filed on Oct. 2, 2008.

(30) Foreign Application Priority Data

May 21, 2008 (IT) .............................. UD2008A0112
Dec. 18, 2008 (IT) .............................. UD2008A0262

(51) Int. Cl.
*B65G 1/06* (2006.01)
(52) U.S. Cl. ............ 198/346.2; 414/222.09; 414/222.11
(58) Field of Classification Search ............... 198/346.2, 198/347.1, 347.4, 378, 457.07, 773; 414/222.07, 414/222.09, 222.11, 226.01
See application file for complete search history.

(56) References Cited

U.S. PATENT DOCUMENTS

| | | | | |
|---|---|---|---|---|
| 4,588,343 A | * | 5/1986 | Garrett .......................... | 414/221 |
| 4,643,629 A | * | 2/1987 | Takahashi et al. ....... | 414/331.17 |
| 4,886,592 A | * | 12/1989 | Anderle et al. .......... | 204/298.25 |
| 4,981,074 A | * | 1/1991 | Machita et al. ................. | 101/35 |
| 5,314,711 A | | 5/1994 | Baccini | |
| 5,379,984 A | * | 1/1995 | Coad et al. ..................... | 251/298 |
| 5,518,599 A | | 5/1996 | Schwartz et al. | |
| 5,730,051 A | | 3/1998 | Takahashi et al. | |
| 5,752,446 A | | 5/1998 | Squibb | |
| 5,863,170 A | * | 1/1999 | Boitnott et al. .......... | 414/222.13 |
| 6,011,629 A | | 1/2000 | Ootake et al. | |
| 6,032,577 A | | 3/2000 | Doyle | |

(Continued)

FOREIGN PATENT DOCUMENTS

DE 20 2005 008 581 U1 10/2006

(Continued)

OTHER PUBLICATIONS

PCT International Search Report and Written Opinion dated Oct. 26, 2009 for International Application No. PCT/EP2009/056024.

(Continued)

*Primary Examiner* — Douglas Hess
(74) *Attorney, Agent, or Firm* — Patterson & Sheridan, LLP

(57) ABSTRACT

Embodiments of the present invention provide an apparatus and method for processing substrates using a multiple screen printing chamber processing system that has an increased system throughput, improved system uptime, and improved device yield performance, while maintaining a repeatable and accurate screen printing process on the processed substrates. In one embodiment, the multiple screen printing chamber processing system is adapted to perform a screen printing process within a portion of a crystalline silicon solar cell production line in which a substrate is patterned with a desired material, and then processed in one or more subsequent processing chambers.

17 Claims, 29 Drawing Sheets

U.S. PATENT DOCUMENTS

| | | | |
|---|---|---|---|
| 6,036,994 | A | 3/2000 | Tanaka et al. |
| 6,054,029 | A * | 4/2000 | Kempf et al. ............ 204/298.25 |
| 6,086,728 | A * | 7/2000 | Schwartz et al. ........ 204/192.12 |
| 6,131,511 | A | 10/2000 | Wachi et al. |
| 6,241,824 | B1 * | 6/2001 | Brauer et al. ................. 118/730 |
| 6,370,748 | B1 | 4/2002 | Baccini et al. |
| 6,554,980 | B1 * | 4/2003 | Patz et al. ................ 204/298.25 |
| 6,595,134 | B2 | 7/2003 | Gisulfo et al. |
| 6,621,517 | B1 | 9/2003 | Squibb |
| 6,702,540 | B2 * | 3/2004 | Olin ............................. 414/217 |
| 6,711,997 | B1 | 3/2004 | Baccini |
| 7,225,734 | B2 | 6/2007 | Schanz |
| 7,908,964 | B2 * | 3/2011 | Yamasaki et al. ............. 101/126 |
| 7,988,398 | B2 * | 8/2011 | Hofmeister et al. .......... 414/217 |
| 2003/0196871 | A1 | 10/2003 | Jones, Jr. |
| 2004/0231146 | A1 | 11/2004 | Fukuhara et al. |
| 2005/0041851 | A1 | 2/2005 | McEvoy et al. |
| 2006/0162587 | A1 | 7/2006 | Winterhalter |
| 2006/0222234 | A1 | 10/2006 | Gaukroger |
| 2006/0268290 | A1 | 11/2006 | Willmann et al. |
| 2006/0280544 | A1 | 12/2006 | Holzer et al. |
| 2007/0114111 | A1 | 5/2007 | Liu |
| 2007/0169654 | A1 | 7/2007 | Baccini et al. |
| 2008/0034990 | A1 | 2/2008 | Hilpert et al. |

FOREIGN PATENT DOCUMENTS

| | | |
|---|---|---|
| EP | 0 582 017 | 2/1994 |
| JP | 61 113766 | 5/1986 |
| JP | 2007-176631 | 7/2007 |
| WO | WO 01/22477 | 3/2001 |
| WO | WO 2009/053786 | 4/2009 |

OTHER PUBLICATIONS

Italian Search Report and Written Opinion dated Aug. 7, 2009 for Italian Patent Application No. UD20080262.

Italian Patent Application No. IT-A-UD 20070198.

* cited by examiner

NEXT GENERATION SCREEN PRINTING SYSTEM

CROSS-REFERENCE TO RELATED APPLICATIONS

This application claims benefit of U.S. provisional patent application Ser. No. 61/102,310, filed Oct. 2, 2008, which is herein incorporated by reference.

BACKGROUND OF THE DISCLOSURE

1. Field of the Invention

The present invention relates to a system used to deposit a patterned layer on a surface of a substrate using a screen printing process.

2. Description of the Background Art

Solar cells are photovoltaic (PV) devices that convert sunlight directly into electrical power. Solar cells typically have one or more p-n junctions. Each junction comprises two different regions within a semiconductor material where one side is denoted as the p-type region and the other as the n-type region. When the p-n junction of a solar cell is exposed to sunlight (consisting of energy from photons), the sunlight is directly converted to electricity through the PV effect. Solar cells generate a specific amount of electric power and are tiled into modules sized to deliver the desired amount of system power. Solar modules are joined into panels with specific frames and connectors. Solar cells are commonly formed on silicon substrates, which may be single or multicrystalline silicon substrates. A typical solar cell includes a silicon wafer, substrate or sheet typically less than about 0.3 mm thick with a thin layer of n-type silicon on top of a p-type region formed on the substrate.

The PV market has experienced growth with annual growth rates exceeding above 30% for the last ten years. Some articles have suggested that solar cell power production world-wide may exceed 10 GWp in the near future. It has been estimated that more than 95% of all solar modules are silicon wafer based. The high market growth rate in combination with the need to substantially reduce solar electricity costs has resulted in a number of serious challenges for inexpensively forming high quality solar cells. Therefore, one major component in making commercially viable solar cells lies in reducing the manufacturing costs required to form the solar cells by improving the device yield and increasing the substrate throughput.

Screen printing has long been used in printing designs on objects, such as cloth, and is used in the electronics industry for printing electrical component designs, such as electrical contacts or interconnects on the surface of a substrate. State of the art solar cell fabrication processes also use screen printing processes.

Therefore, there is a need for a screen printing apparatus for the production of solar cells, electronic circuits, or other useful devices that has increased throughput and a lower cost of ownership than other known apparatuses.

SUMMARY OF THE INVENTION

Embodiments of the present invention generally provide an apparatus for depositing a patterned material on a surface of a substrate, comprising a rotary actuator having a rotational axis, a first substrate support and a second substrate support that are each coupled to the rotary actuator, a first conveyor comprising an upper section for supporting a belt member, wherein the upper section of the first conveyor is configured to extend from a retracted position to an extended position, and wherein the upper section of the first conveyor is positioned to transfer a substrate to the first substrate support when the rotary actuator is angularly positioned in a first orientation and when the upper section of the first conveyor is positioned in the extended position, a second conveyor comprising an upper section for supporting a belt member, wherein the upper section of the second conveyor is configured to extend from a retracted position to an extended position, and wherein the upper section of the second conveyor is positioned to transfer a substrate to the second substrate support when the rotary actuator is angularly positioned in the first orientation and the upper section of the second conveyor is positioned in the extended position.

Embodiments of the invention further provide an apparatus for depositing a patterned material on a surface of a substrate, comprising a rotary actuator having a rotational axis and a first and second substrate support coupled thereto and positioned on opposing sides of the rotary actuator, a first conveyor with an upper section for supporting a belt member, wherein the upper section of the first conveyor is movable with respect to a lower section of the first conveyor in a plane substantially perpendicular to the rotational axis of the rotary actuator, a second conveyor with an upper section for supporting a belt member, wherein the upper section of the second conveyor is movable with respect to a lower section of the second conveyor in a plane substantially perpendicular to the rotational axis of the rotary actuator.

Embodiments of the invention further provide a method of processing a substrate, comprising orienting a rotary actuator in a first angular position, wherein the rotary actuator has a first substrate support, a second substrate support, a third substrate support, and a fourth substrate support, receiving a first substrate on a first conveyor and a second substrate on a second conveyor, transferring the first substrate from the first conveyor to the first substrate support while the rotary actuator is oriented in the first angular position, transferring the second substrate from the second conveyor to the second substrate support while the rotary actuator is oriented in the first angular position, wherein transferring the first substrate to the first substrate support and transferring the second substrate to the second substrate support is performed substantially simultaneously, laterally retracting an upper section of each of the first and second conveyors, rotating the rotary actuator from the first angular position to a second angular position so that the third substrate support is positioned to receive a substrate from the first conveyor and the fourth substrate support is positioned to receive a substrate from the second conveyor, depositing a material on the first substrate disposed on the first substrate support in a first screen printing chamber when the rotary actuator is oriented in the second angular position, and depositing a material on the second substrate disposed on the second substrate support in a second screen printing chamber when the rotary actuator is oriented in the second angular position.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

FIGS. 6AA-6HH illustrate schematic isometric views of the components in the screen printing system during different stages of a substrate processing sequence according to another embodiment of the invention.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention provide an apparatus and method for processing substrates in a multiple screen printing chamber processing system that has an increased system throughput, improved system uptime, and improved device yield performance, while maintaining a repeatable and accurate screen printing process on the processed substrates. In this configuration the footprint of the multiple screen printing chamber processing system remains substantially the same. In one embodiment, the multiple screen printing chamber processing system, hereafter system, is adapted to perform a screen printing process within a portion of a crystalline silicon solar cell production line in which a substrate is patterned with a desired material, and is then processed in one or more subsequent processing chambers. The subsequent processing chambers may be adapted to perform one or more bake steps and one or more cleaning steps. In one embodiment, the system is a module positioned within the Softline™ tool available from Baccini S.p.A., which is owned by Applied Materials, Inc. of Santa Clara, Calif.

Screen Printing System

Figure 1:
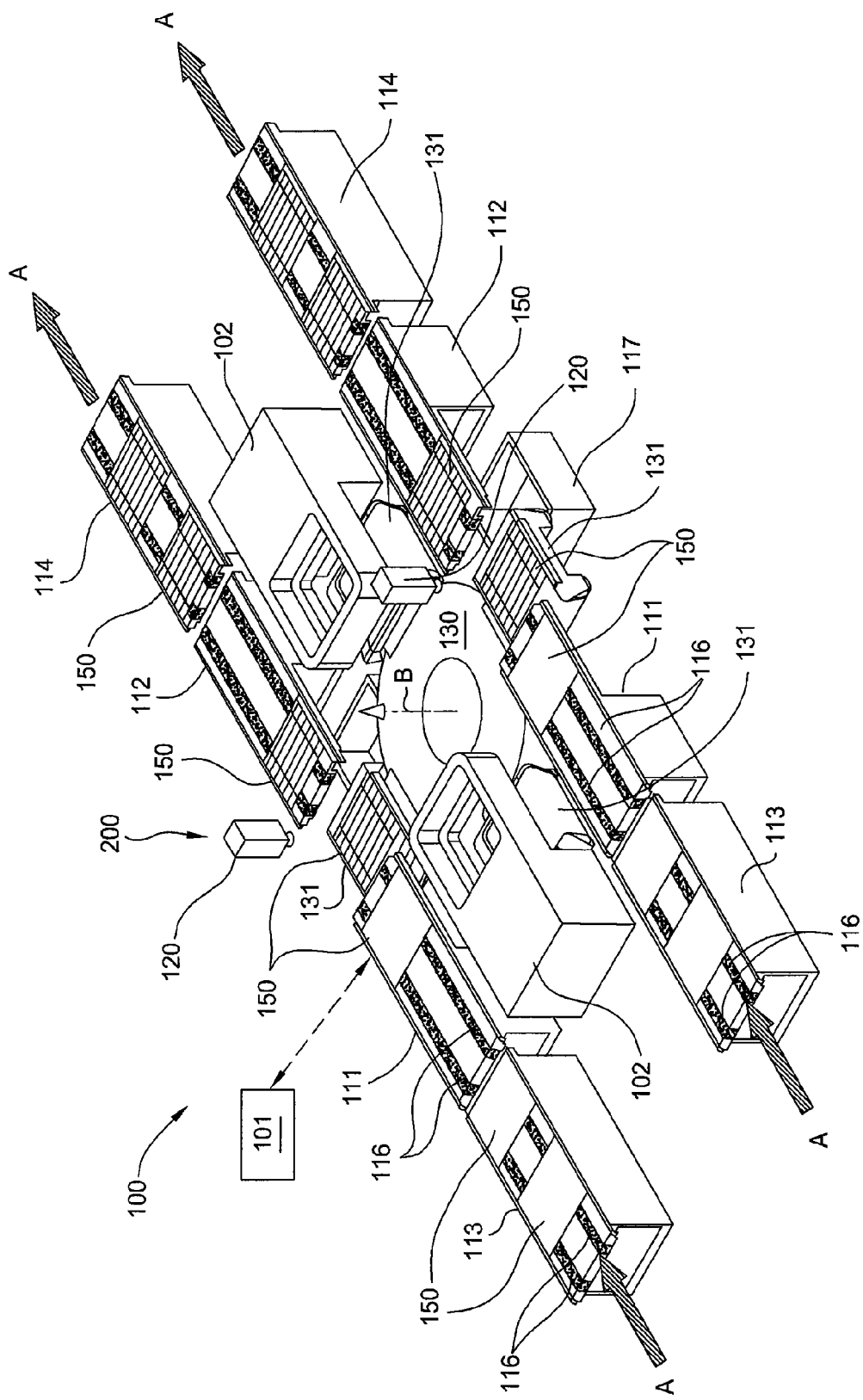
FIG. 1 is an isometric view of a screen printing system according to one embodiment of the invention.
Figure 2:
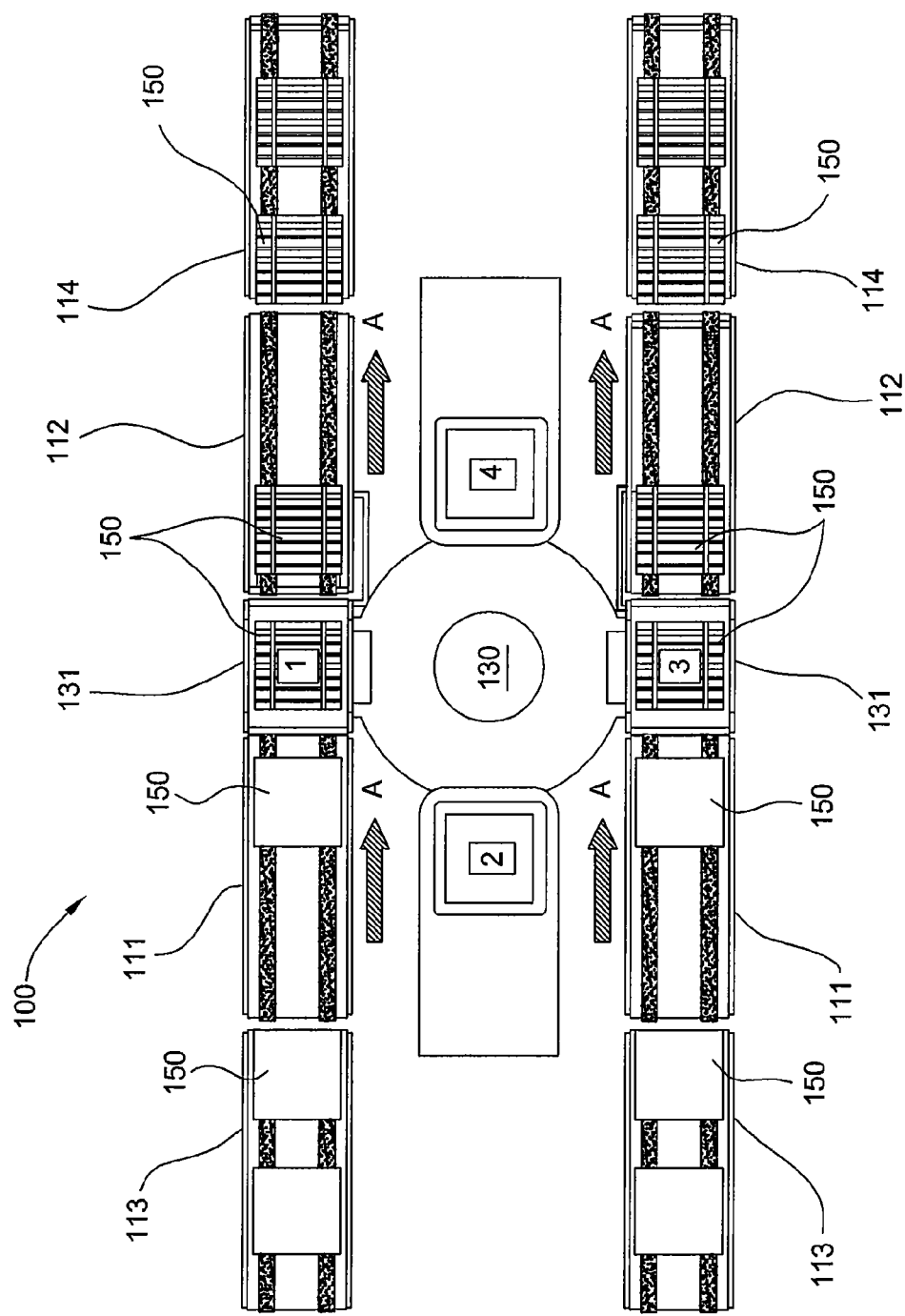
FIG. 2 is a plan view of the screen printing system illustrated in FIG. 1 according to one embodiment of the invention.

FIGS. 1-2 illustrate one embodiment of a multiple screen printing chamber processing system, or system 100, that may be used in conjunction with various embodiments of this invention. In one embodiment, the system 100 generally includes two incoming conveyors 111, a rotary actuator assembly 130, two screen print heads 102, and two outgoing conveyors 112. Each of the two incoming conveyors 111 are configured in a parallel processing configuration so that they each can receive substrates from an input device, such as an input conveyor 113, and transfer the substrate to a printing nest 131 coupled to the rotary actuator assembly 130. Also, each of the outgoing conveyors 112 are configured to receive processed substrates from the printing nest 131 coupled to the rotary actuator assembly 130 and transfer each processed substrate to a substrate removal device, such as an exit conveyor 114. The input conveyor 113 and exit conveyor 114 are generally automated substrate handling devices that are part of a larger production line, for example the Softline™ tool, that is connected to the system 100.

FIG. 2 is a plan view of one embodiment of the system 100 that schematically illustrates the position of the rotary actuator assembly 130 in which two of the printing nests 131 (e.g., reference numerals "1" and "3") are oriented so that they can transfer a substrate 150 from each of the printing nests 131 to the outgoing conveyor 112 and each receive a substrate 150 from each of the incoming conveyors 111. The substrate motion thus generally follows the path "A" shown in FIGS. 1 and 2. In this configuration the other two printing nests 131 (e.g., reference numerals "2" and "4") are oriented so that a screen printing process can be performed on the substrates 150 that are positioned within the two screen printing chambers (i.e., screen print heads 102 in FIG. 1). Also, in this configuration, the printing nests 131 are oriented such that the direction of substrate movement on the nest is tangential to the rotary actuator assembly 130, which is different from other commercially available systems that have a radially oriented substrate movement. A tangential orientation of the conveyors to the rotary actuator assembly 130 allows the substrates to be delivered and received from two locations, for example reference numerals "1" and "3" (FIG. 2), without increasing the footprint of the system.

One advantage of the parallel processing configuration illustrated in FIGS. 1-2 is that if one of the conveyors or print heads 102 becomes inoperable, or is taken down for servicing, the system can still continue to process substrates using the other conveyor and print head 102. Generally, the various embodiments described herein have advantages over prior art configurations because the use of two printing heads that can process substrates in parallel will double throughput, while not fundamentally changing the screen process performed on the substrates. It is believed that when only one substrate is screen printed at a time, printing accuracy can remain very high, since the print head 102 only needs to be precisely aligned to a single substrate rather than two or more substrates at one time. This configuration thus is used to increase the system throughput and system uptime, without affecting the accuracy of the screen printing process.

The two screen print heads 102 utilized in the system 100 may be conventional screen printing heads available from Baccini S.p.A. which are adapted to deposit material in a desired pattern on the surface of a substrate positioned on a printing nest 131 during the screen printing process. In one embodiment, the screen print heads 102 are adapted deposit a metal containing or dielectric containing material on a solar cell substrate. In one example, the solar cell substrate has a width between about 125 mm and 156 mm in size and a length between about 70 mm and 156 mm.

Figure 3:
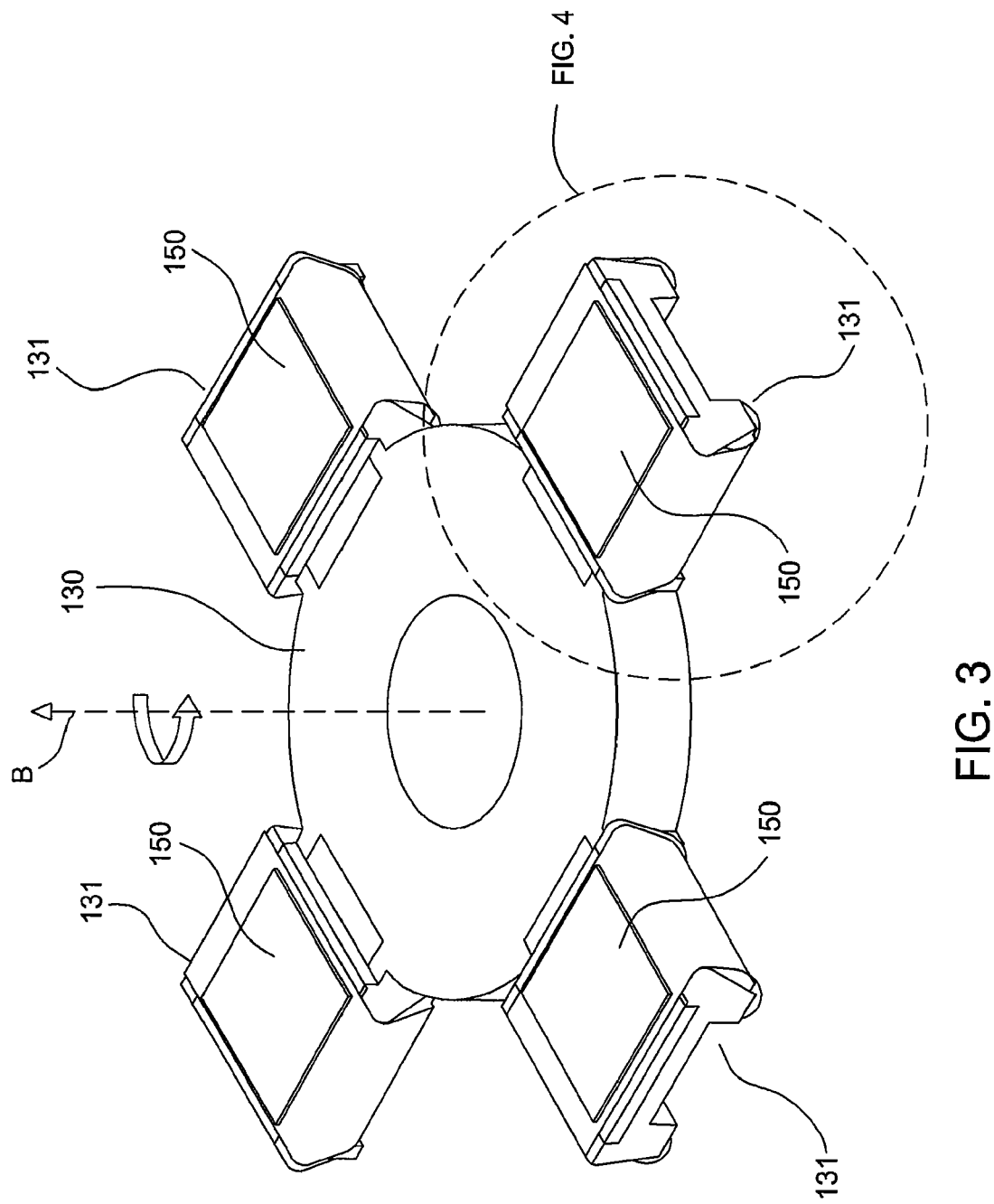
FIG. 3 is an isometric view of a rotary actuator assembly according to one embodiment of the invention.

In one embodiment, as shown in FIGS. 1-3, the rotary actuator assembly 130 includes four printing nests 131 that are each adapted to support a substrate 150 during the screen printing process performed within each of the screen print heads 102. FIG. 3 is an isometric view of one embodiment of the rotary actuator assembly 130 that illustrates a configuration in which a substrate 150 disposed on each of the four printing nests 131. The rotary actuator assembly 130 can be rotated and angularly positioned about the axis "B" by the use of a rotary actuator (not shown) and the system controller 101 so that the printing nests 131 can be desirably positioned within the system. The rotary actuator assembly 130 may also have one or more supporting components that facilitate the control of the printing nests 131 or other automated devices that are used to perform a substrate processing sequence in the system 100.

Figure 4:
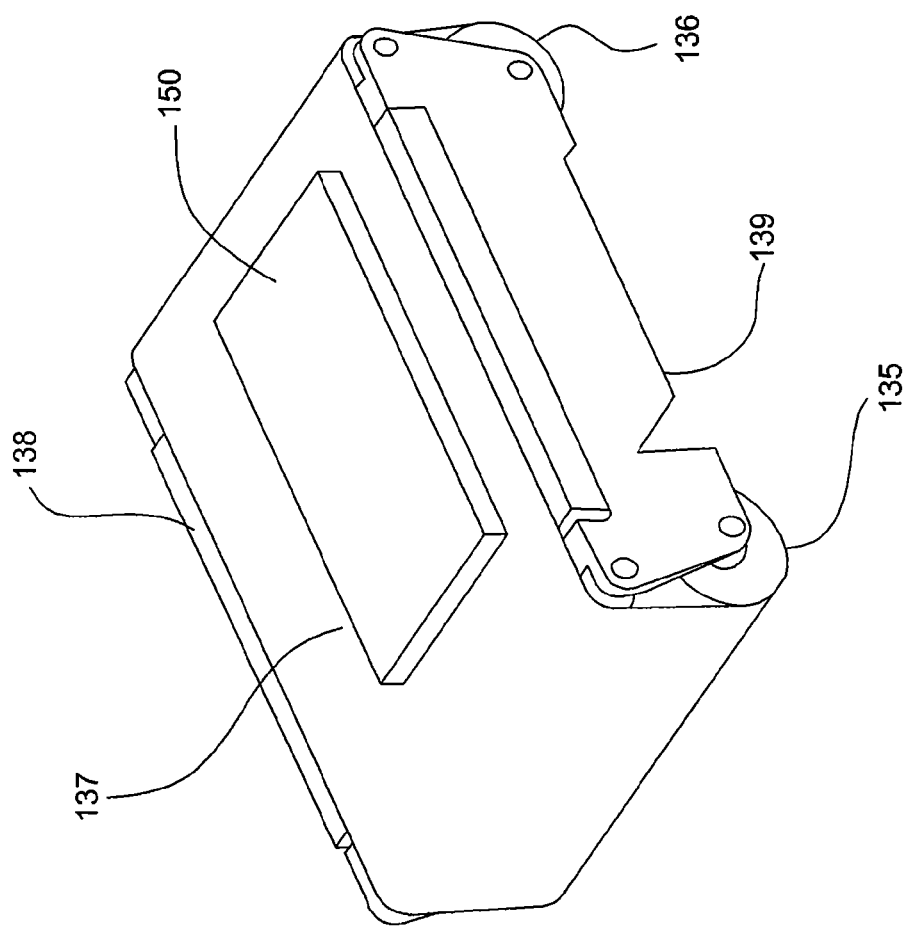
FIG. 4 is an isometric view of a printing nest portion of the screen printing system according to one embodiment of the invention.

As illustrated in FIG. 4, each printing nest 131 generally comprises a conveyor 139 that has a feed spool 135 and a take-up spool 136 that are adapted to feed and retain a material 137 positioned across a platen 138. In one embodiment, the material 137 is a porous material that allows a substrate 150 disposed on one side of the material 137 to be held to the platen 138 by a vacuum applied to the opposing side of the material 137 by vacuum ports formed in the platen 138. The platen 138 generally has a substrate supporting surface on which the substrate 150 and material 137 are supported and retained during the screen printing process performed in the screen print head 102. In one embodiment, the material 137 is a thin paper material. In one configuration, a nest drive mechanism (not shown) is coupled to, or is adapted to engage with, the feed spool 135 and a take-up spool 136 so that the movement of a substrate 150 positioned on the material 137 can be accurately controlled within the printing nest 131.

The incoming conveyor 111 and outgoing conveyor 112 generally include at least one belt 116 that is able to support and transport the substrates 150 to a desired position within the system 100 by use of an actuator (not shown) that is in communication with the system controller 101. While FIGS. 1-2 generally illustrate a two belt 116 style substrate transferring system, other types of transferring mechanisms may be used to perform the same substrate transferring and positioning function(s) without varying from the basic scope of the invention.

In one embodiment, as illustrated in FIGS. 1-2, when the rotary actuator assembly 130 rotates, the printing nests 131 sweep out a volume that intersects with portions of the incoming conveyor 111 and outgoing conveyor 112. In such an embodiment, relative motion along a vertical axis (B-axis in FIG. 1) between the printing nests 131 and incoming and outgoing conveyors 111, 112 is needed to allow the rotary actuator assembly 130 to freely rotate. In one embodiment, the incoming and outgoing conveyors 111, 112 can be positioned above the printing nests 131 so that the printing nests 131 will pass underneath the incoming and outgoing conveyors 111, 112 as the rotary actuator assembly 130 is rotated. In another embodiment, the entire rotary actuator assembly 130 and all of the printing nests 131 can be moved vertically, i.e., parallel to axis "B", to avoid interference with the incoming and outgoing conveyors 111, 112. In another embodiment, each individual printing nest may be moved vertically to similarly avoid interference with the incoming and outgoing conveyors 111, 112. Movement of the incoming and outgoing conveyors 111, 112, the printing nests 131, or the rotary actuator assembly 130 may be controlled by use of one or more conventional actuators devices that are in communication with the system controller 101. In one embodiment, the printing nests 131 are coupled to a linear motor (not shown) and other supporting components that are adapted position the printing nests 131 in a vertical direction relative to the rotary actuator assembly 130 with high precision. In this configuration, the linear motor and other supporting components are used to assure that a repeatable and an accurate vertical position of the printing nests 131 can be achieved to assure that screen printing process results will not appreciably vary from one substrate to the next.

Figure 6A:
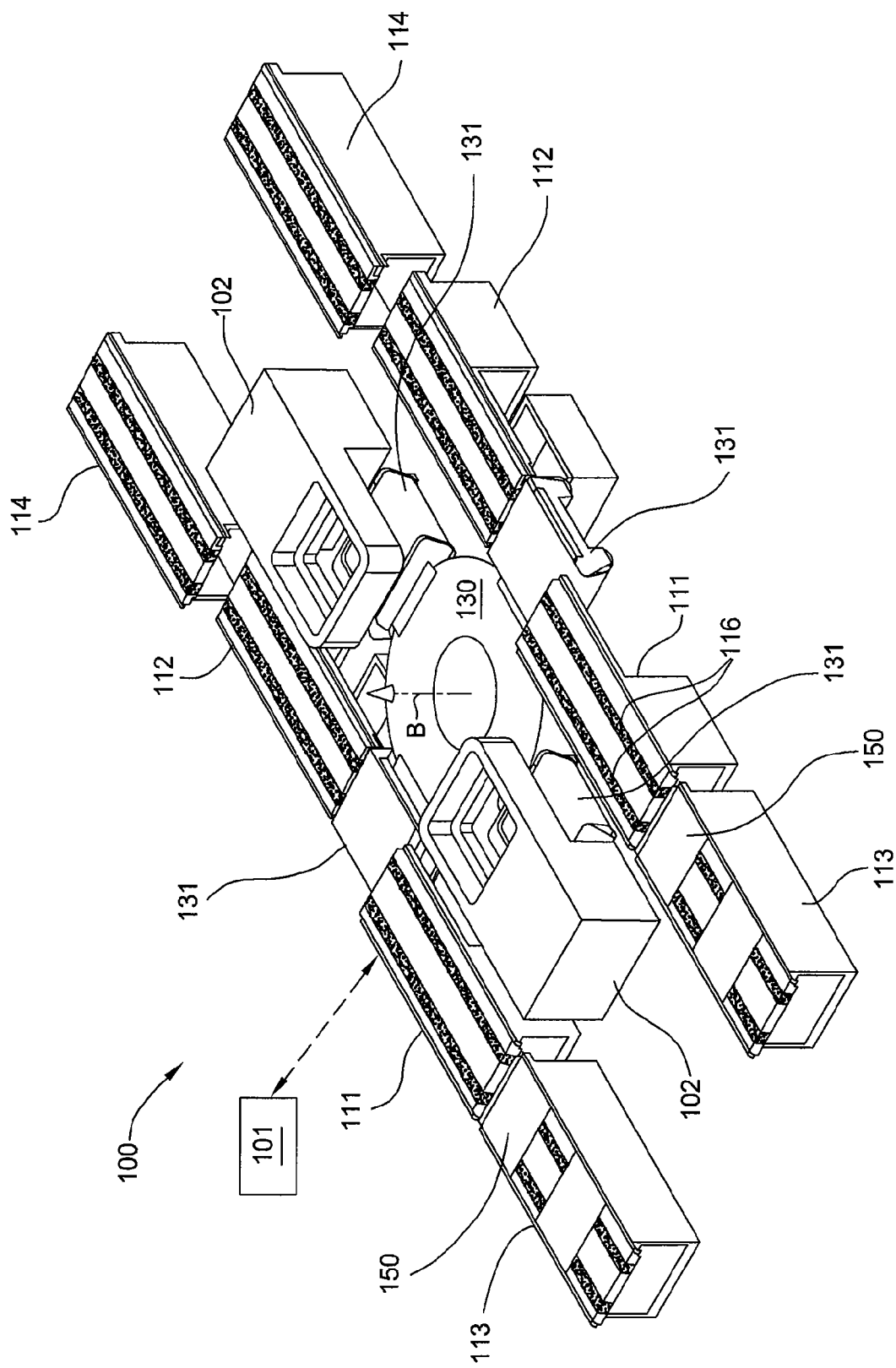
FIGS. 6A-6H illustrate schematic isometric views of the components in the screen printing system during different stages of a substrate processing sequence according to one embodiment of the invention.
Figure 6A:
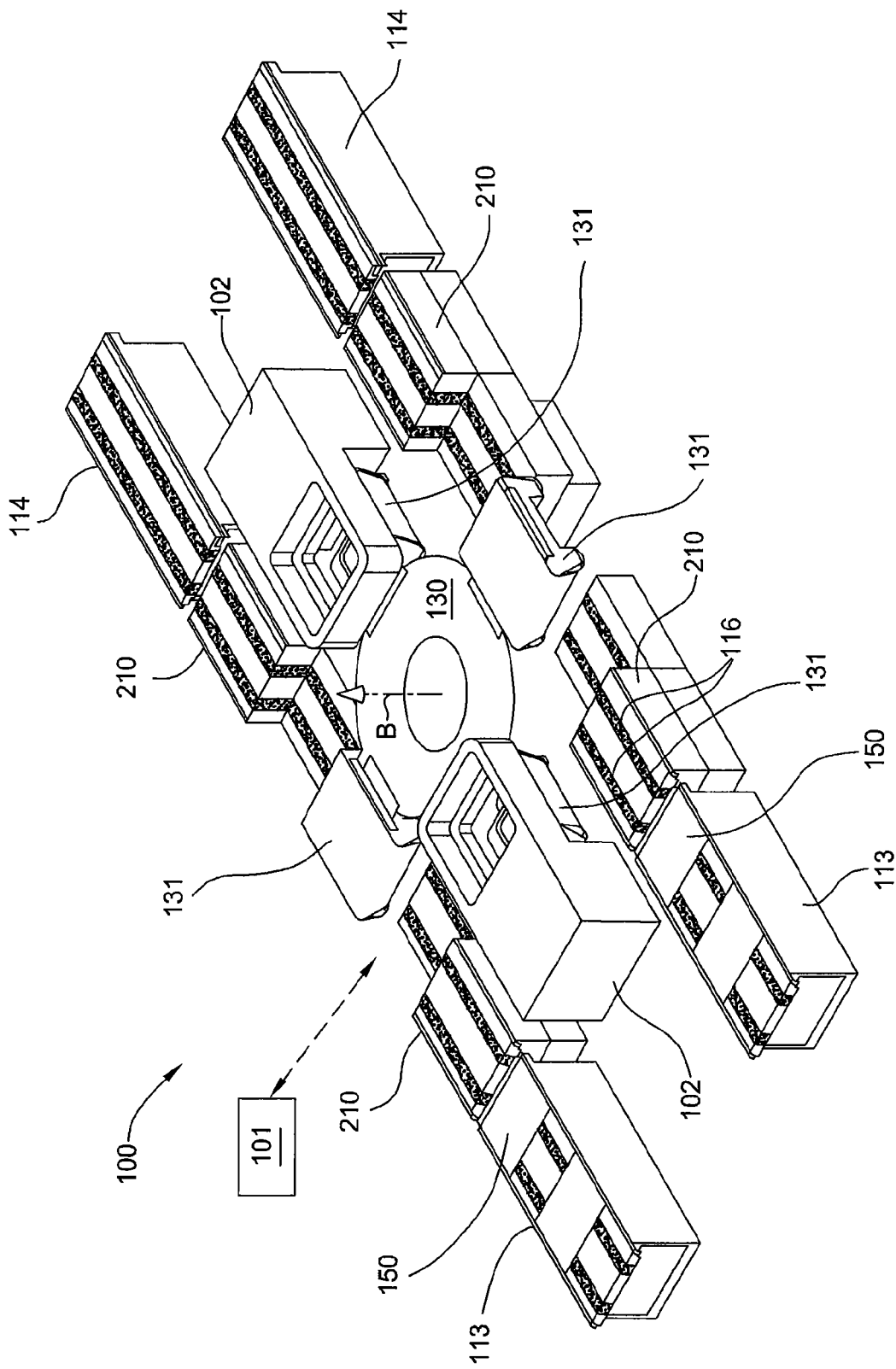
Figure 9A:
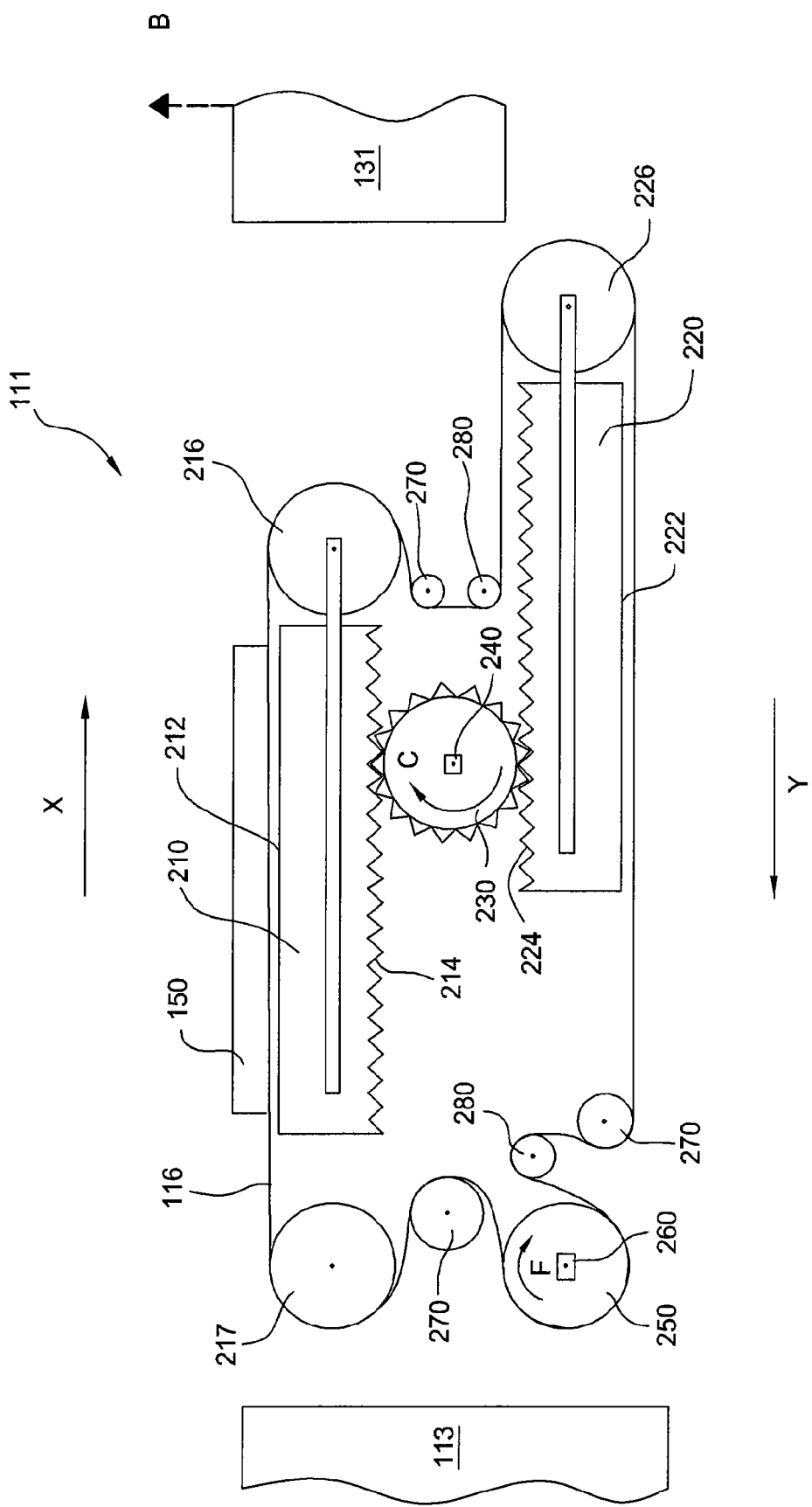
FIGS. 9A-9B are simplified, schematic views of an incoming or outgoing conveyor according to one embodiment of the present invention.
Figure 9B:
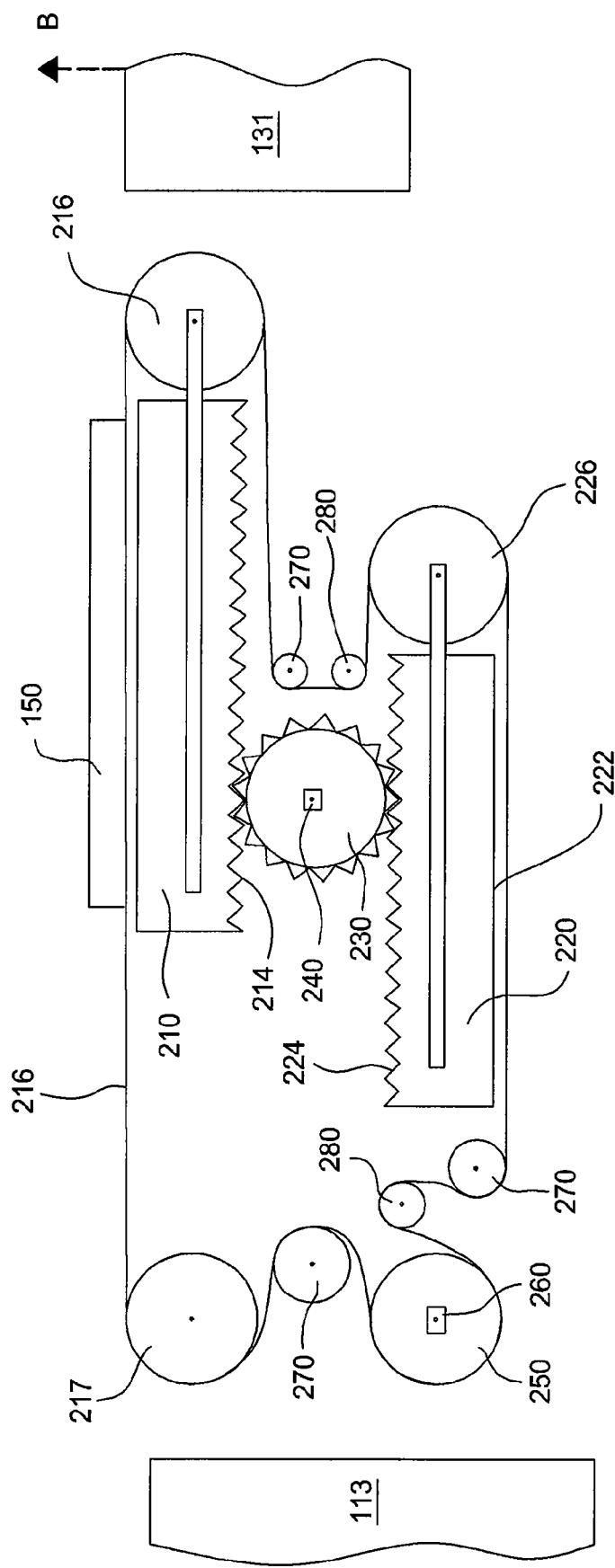

In another embodiment, shown in FIGS. 6AA-6HH, the incoming and outgoing conveyors 111, 112 are configured to allow the rotary actuator assembly 130 to freely rotate through translational extension and retraction of an upper section of the incoming and outgoing conveyors 111, 112 in the plane of the path "A" (FIG. 1). In this embodiment, upper and lower sections of the incoming and outgoing conveyors 111, 112 are configured for opposing translational extension and retraction parallel to path "A", as subsequently described with respect to FIGS. 6AA-6HH. The extension and retraction of the incoming and outgoing conveyors 111, 112 may be controlled through actuator devices that are in communication with the system controller 101. An example of an actuator device is illustrated in FIGS. 9A-9B, which is discussed below.

In one embodiment, the system 100 also includes an inspection assembly 200, which is adapted to inspect the substrates 150 before or after the screen printing process has been performed. The inspection assembly 200 may include one or more cameras 120 that are positioned to inspect an incoming or processed substrate positioned in the positions "1" and "3," as shown in FIGS. 1 and 2. The inspection assembly 200 generally includes at least one camera 120 (e.g., CCD camera) and other electronic components that are able to inspect and communicate the inspection results to the system controller 101 so that damaged or mis-processed substrates can be removed from the production line. In one embodiment, the printing nests 131 may each contain a lamp, or other similar optical radiation device, to illuminate a substrate 150 positioned over the platen 138 so that it can be more easily inspected by an inspection assembly 200.

The system controller 101 is generally designed to facilitate the control and automation of the overall system 100 and typically may include a central processing unit (CPU) (not shown), memory (not shown), and support circuits (or I/O) (not shown). The CPU may be one of any form of computer processors that are used in industrial settings for controlling various chamber processes and hardware (e.g., conveyors, detectors, motors, fluid delivery hardware, etc.) and monitor the system and chamber processes (e.g., substrate position, process time, detector signal, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 101 determines which tasks are performable on a substrate. Preferably, the program is software readable by the system controller 101, which includes code to generate and store at least substrate positional information, the sequence of movement of the various controlled components, substrate inspection system information, and any combination thereof.

Transferring Sequence

FIGS. 6A-6H and 6AA-6HH are isometric views of alternate embodiments of the system 100 during different stages in a substrate processing sequence 500 (FIG. 5) used to form a patterned structure on a surface of the substrates 150 using the screen print heads 102. The processing sequence illustrated in FIGS. 5 and 7 corresponds to the stages depicted in FIGS. 6A-6H and 6AA-6HH, which are discussed herein. FIG. 7 illustrates an example of the transfer steps that the substrate 150 may follow as it is transferred through system 100 following the processing sequence 500 described in FIG. 5. Steps 502-512 illustrate the initial processing sequence steps for the first pair of substrates 150 loaded and processed in the system 100. Steps 514-526 illustrate the steps commonly performed after the system 100 is loaded and running. FIGS. 6A and 6AA depict alternate embodiments of the system 100 configured at an initial starting point in which at least one pair of substrates 150 are positioned on each of the input conveyors 113 and are ready to be loaded onto the incoming conveyor 111.

In the embodiment depicted in FIG. 6A, the incoming conveyors 111 are depicted in an upper position such that their upper surfaces are substantially in plane with the upper surface of the corresponding input conveyor 113 for transfer of the substrate 150. In the embodiment depicted in FIG. 6AA, the upper sections 210 of the incoming conveyors 111 and outgoing conveyors 112 are depicted in a retracted position. In this configuration, the incoming conveyors 111 are configured and aligned to receive a substrate 150 from the input conveyor 113, and the outgoing conveyor 112 is configured and aligned to transfer a substrate to the exit conveyors 114.

Figure 5:
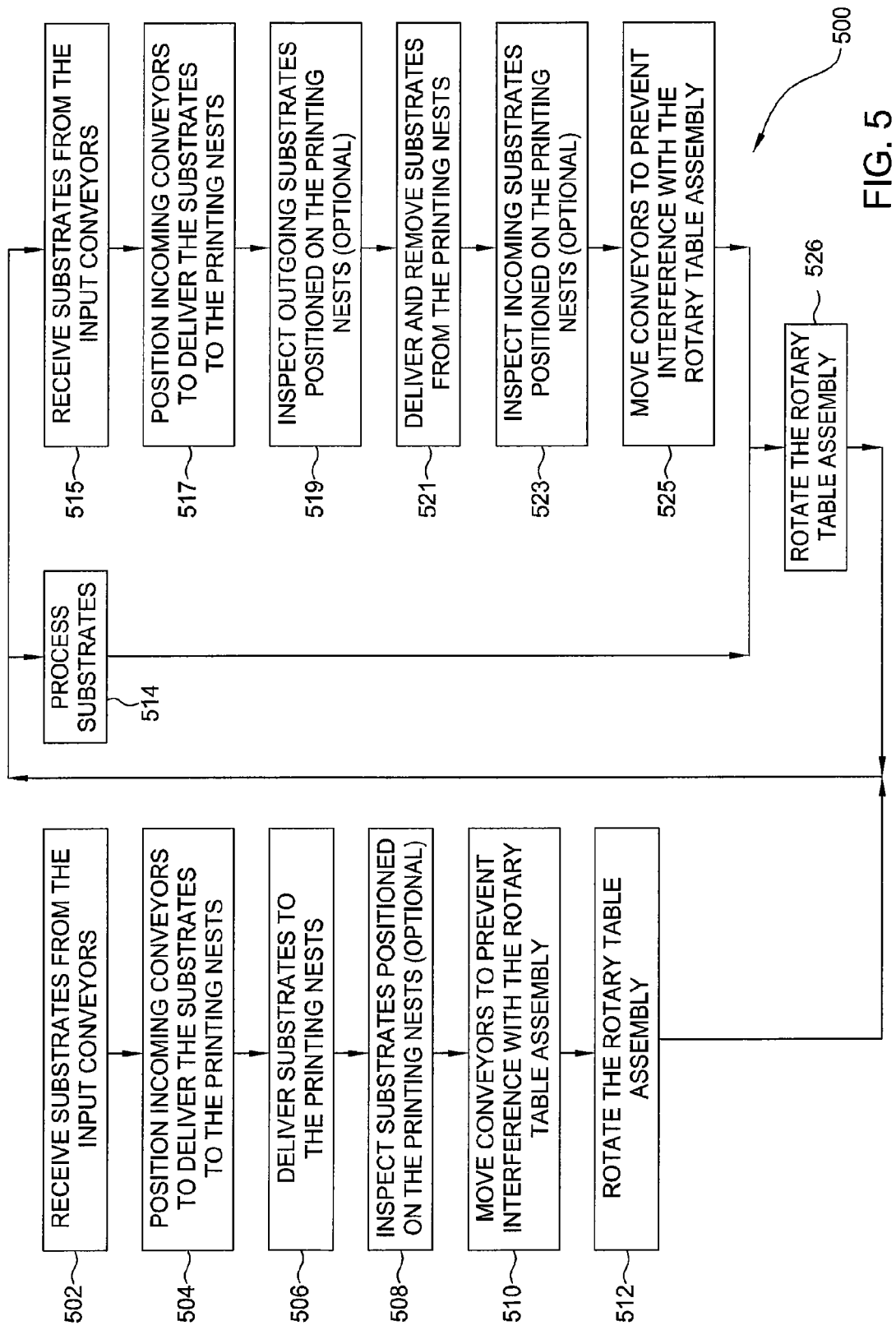
FIG. 5 illustrates a flow chart of a substrate processing sequence according to one embodiment of the invention.

At step 502, shown in FIGS. 5 and 7, a first pair of substrates 150 are received from each of the input conveyors 113 by their respective incoming conveyor 111 following the transfer path A1 (FIG. 7). In this configuration the system controller 101 is used to coordinate the motion of the belt(s) 116 and drive actuators (not shown) found in each input conveyor 113 and incoming conveyor 111 so that the substrates can be reliably transferred between these automation components.

Figure 6B:
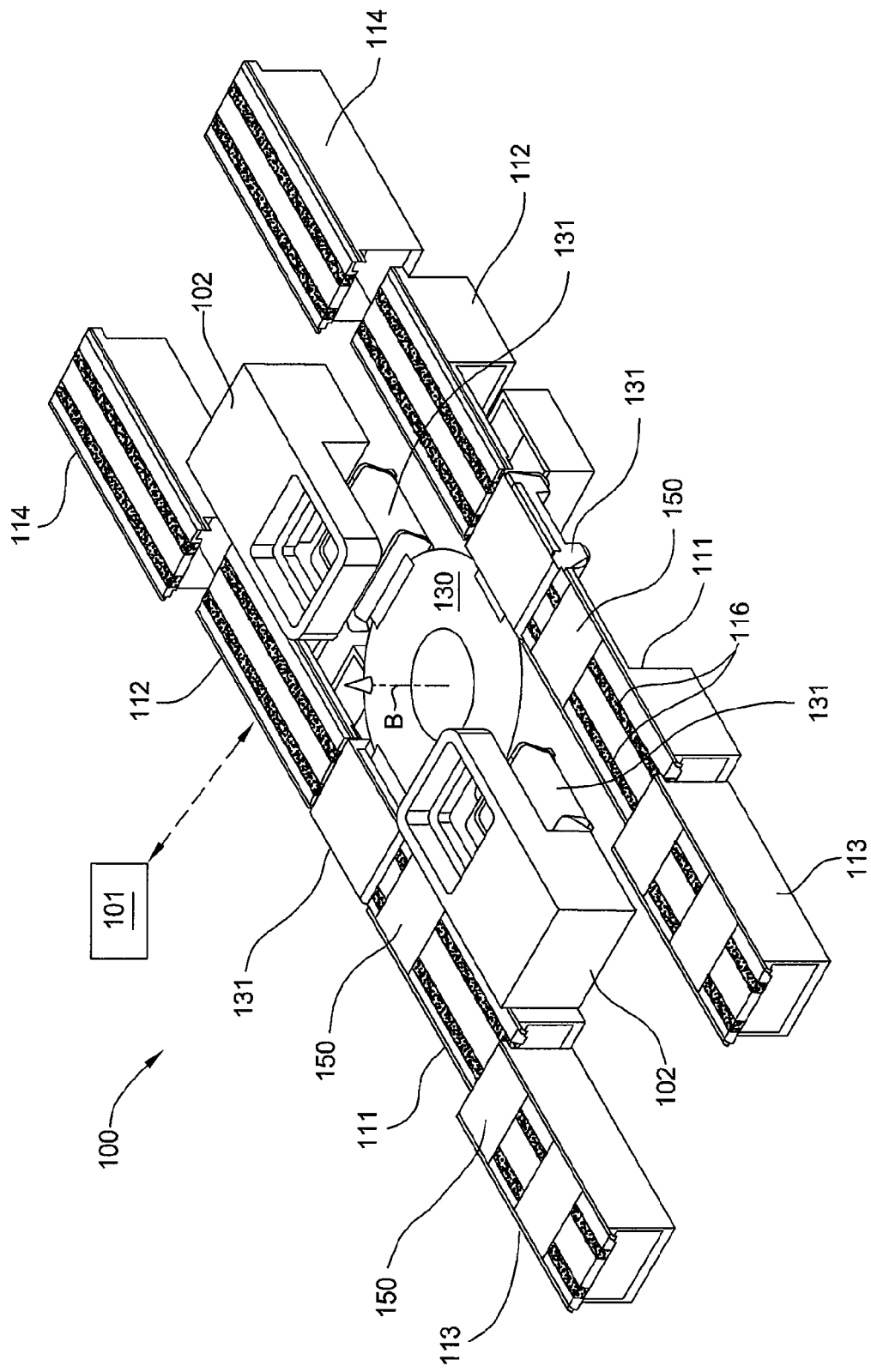
Figure 6B:
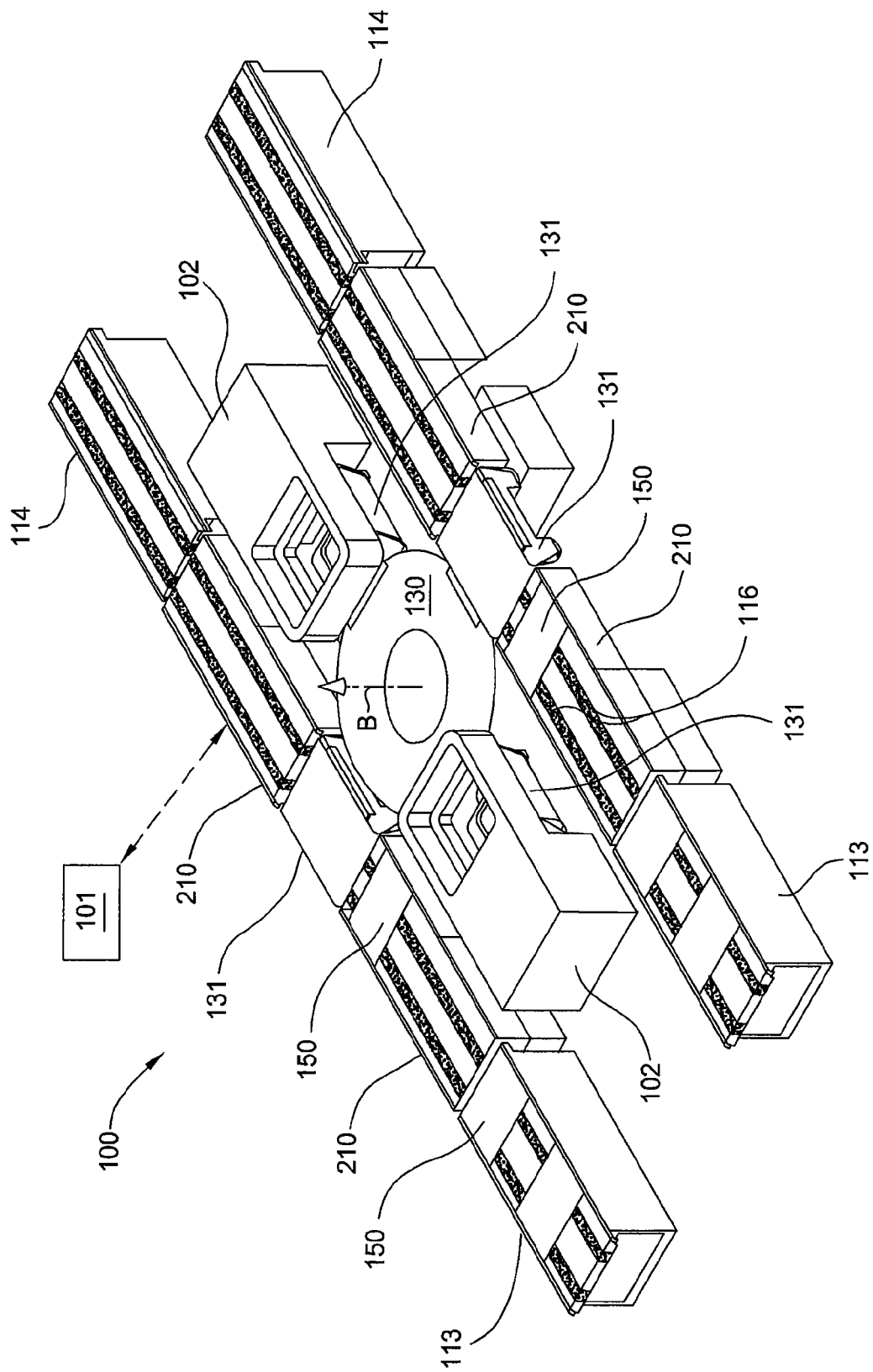
Figure 7:
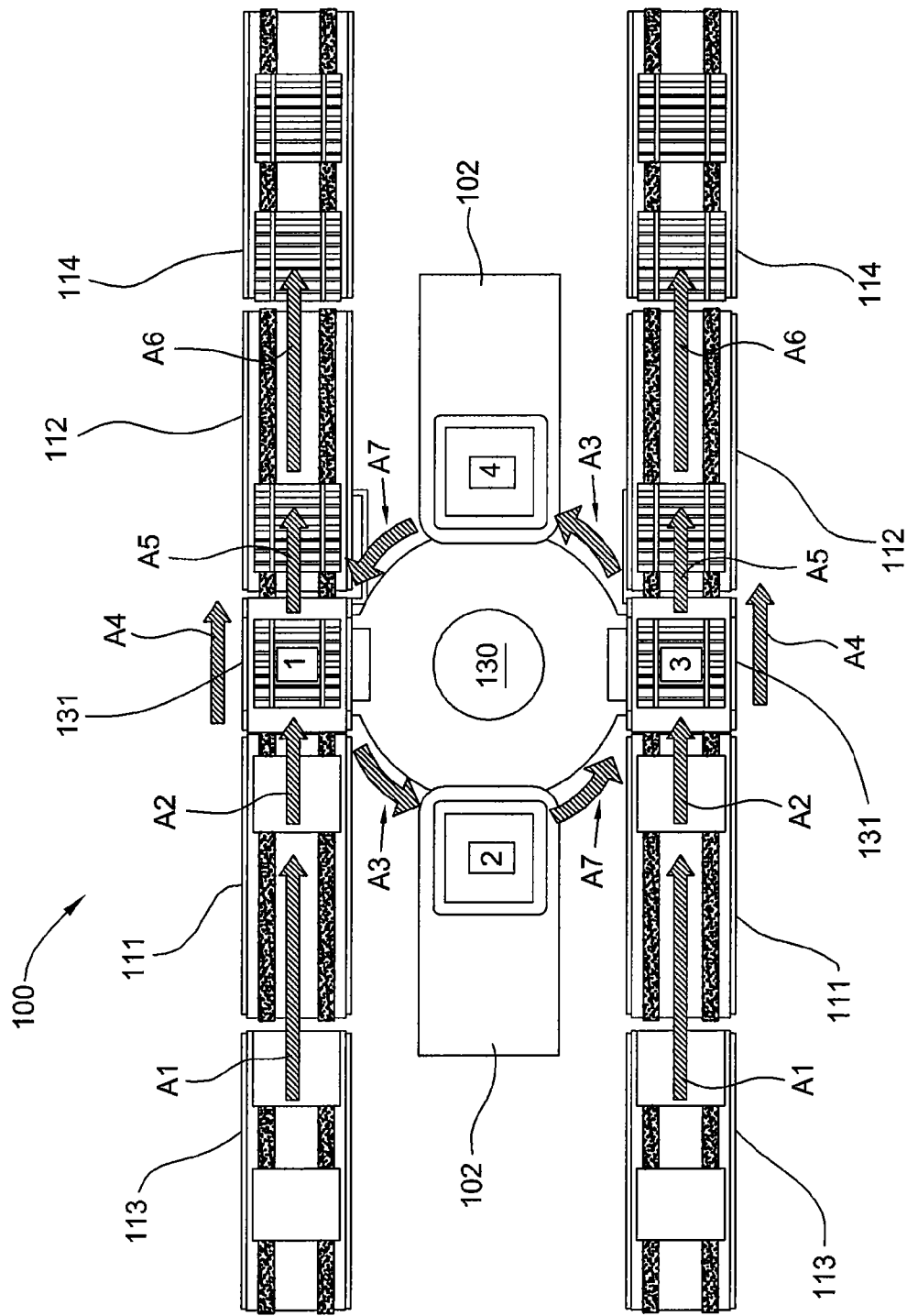
FIG. 7 schematically illustrates the movement of substrates through the screen printing system according to one embodiment of the invention.

At step 504, shown in FIGS. 5, 6B and 6BB, each of the incoming conveyors 111 are positioned so that they can deliver the first pair of substrates 150 to the printing nests 131 located in positions "1" and "3" (FIG. 7) in the next processing sequence step. In one embodiment, shown in FIG. 6B, the incoming conveyors 111 are lowered to align with each of the printing nests 131. To lower the substrate supporting surfaces in the incoming conveyors 111 the system controller 101 is used to control an actuator (not shown) that is contained within the incoming conveyor 111 assembly. In an alternate embodiment, shown in FIG. 6BB, the upper sections 210 of the incoming conveyors 111 and outgoing conveyors 112 are extended in a horizontal direction substantially aligned with each of the printing nests 131. One embodiment of the mechanisms for the translational extension of the upper sections 210 of the incoming conveyors 111 and outgoing conveyors 112 are subsequently described with respect to FIGS. 9A-9B.

Figure 6C:
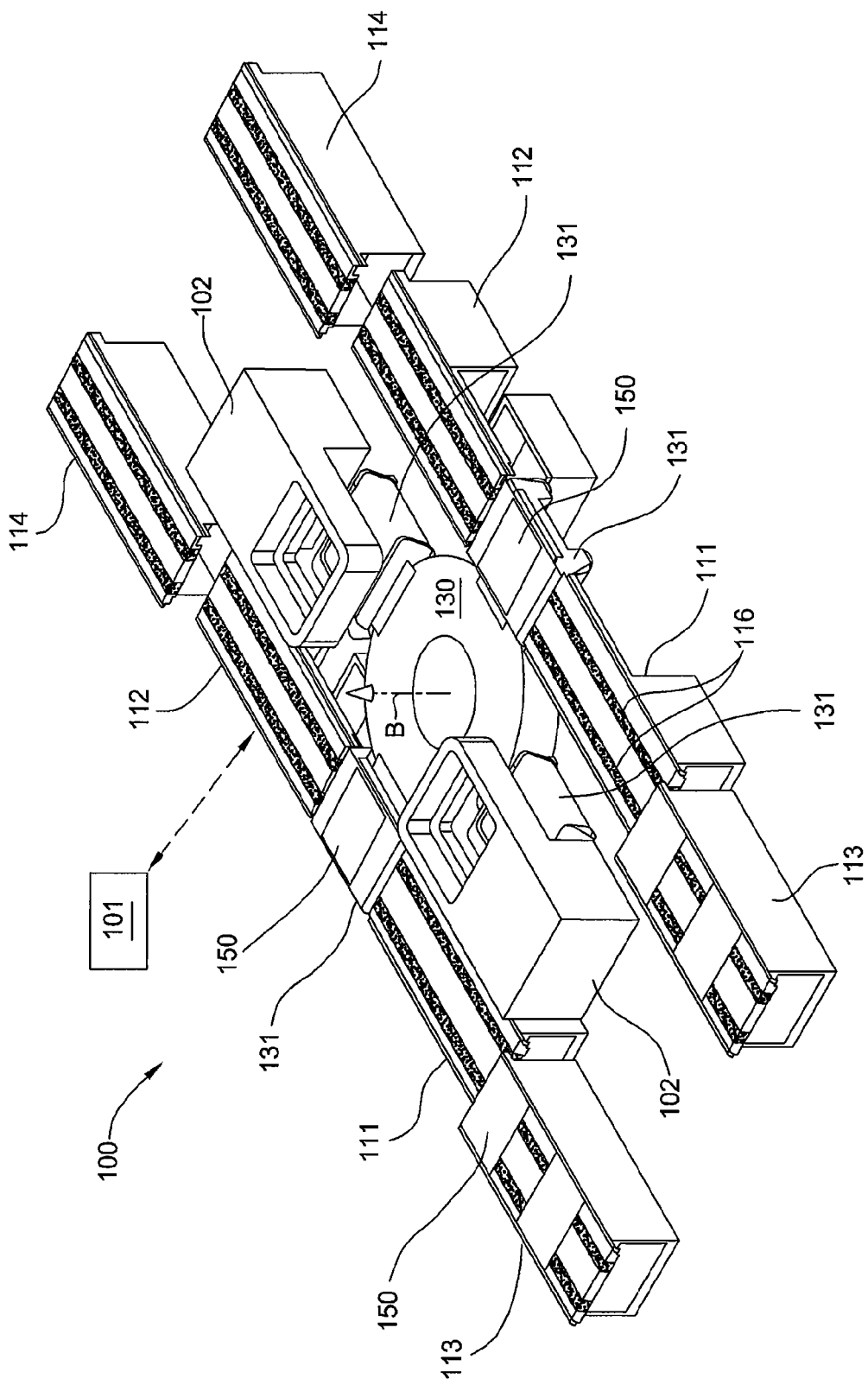
Figure 6C:
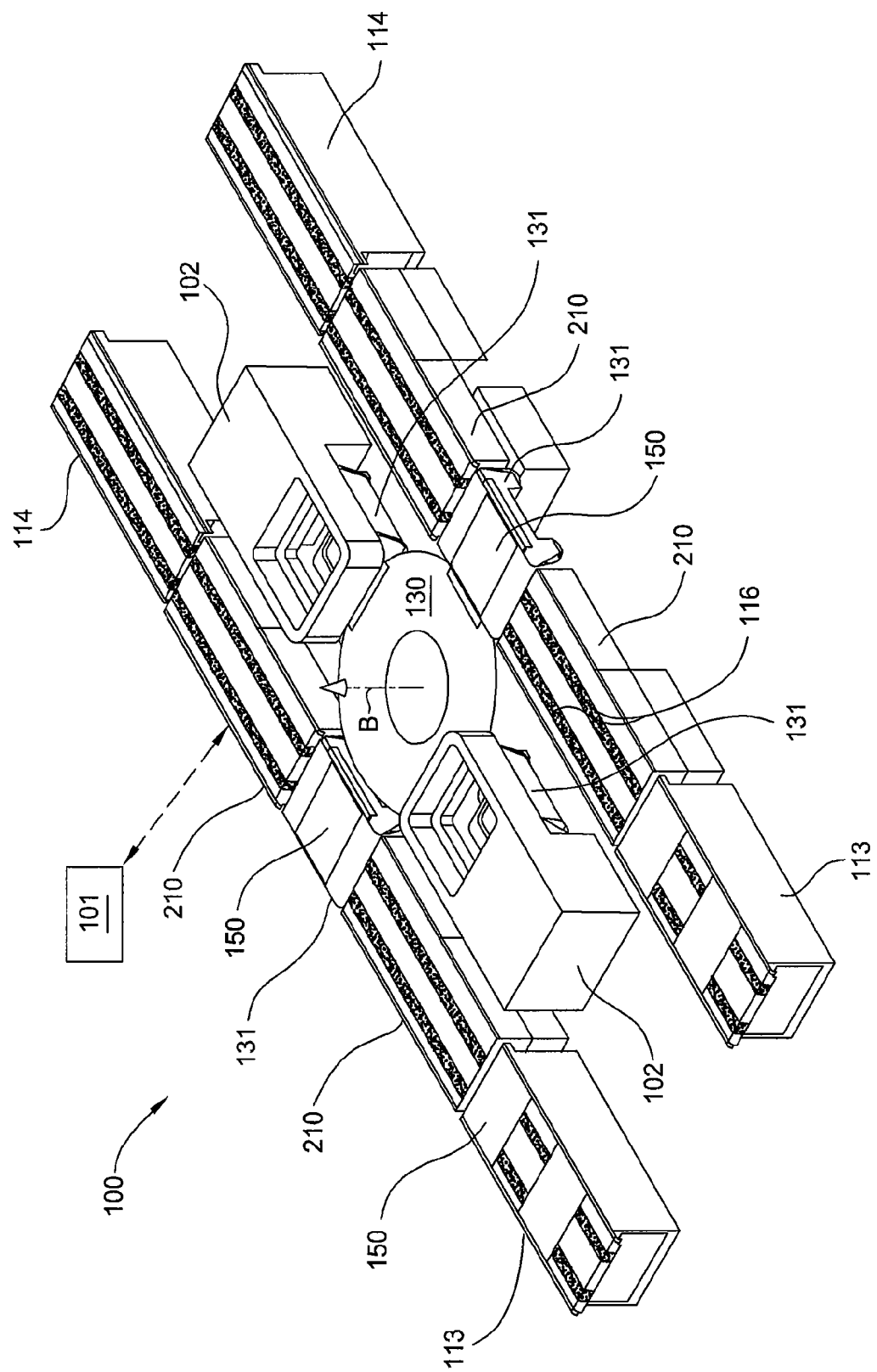

At step 506, shown in FIGS. 6C, 6CC, and 7, the first pair of substrates 150 are transferred from each of the belts 116 of the incoming conveyors 111 to the material 137 in the printing nests 131 following the transfer paths A2 (FIG. 7). In this configuration the system controller 101 is used to coordinate the motion of the belt(s) 116 and the nest drive mechanism (not shown), which is used to position the material 137 so that the substrates can be reliably positioned within the printing nests 131.

At step 508, the first pair of substrates 150 may be inspected by the components in the inspection assembly 200 to assure that there are no broken, chipped or cracked substrates positioned on the printing nests 131. The inspection assemblies can also be used to determine the precise position of the substrates on each of the printing nests 131. The location data of each substrate 150 on each printing nest 131 can be used by the system controller 101 to position and orient the screen print head components in the screen print head 102 to improve the accuracy of the subsequent screen printing process. In this case the position of each of the print heads can be automatically adjusted to align the screen print head 102 to the exact position of the substrate positioned on the printing nest 131 based on the data received during inspection process performed during step 508.

Figure 6D:
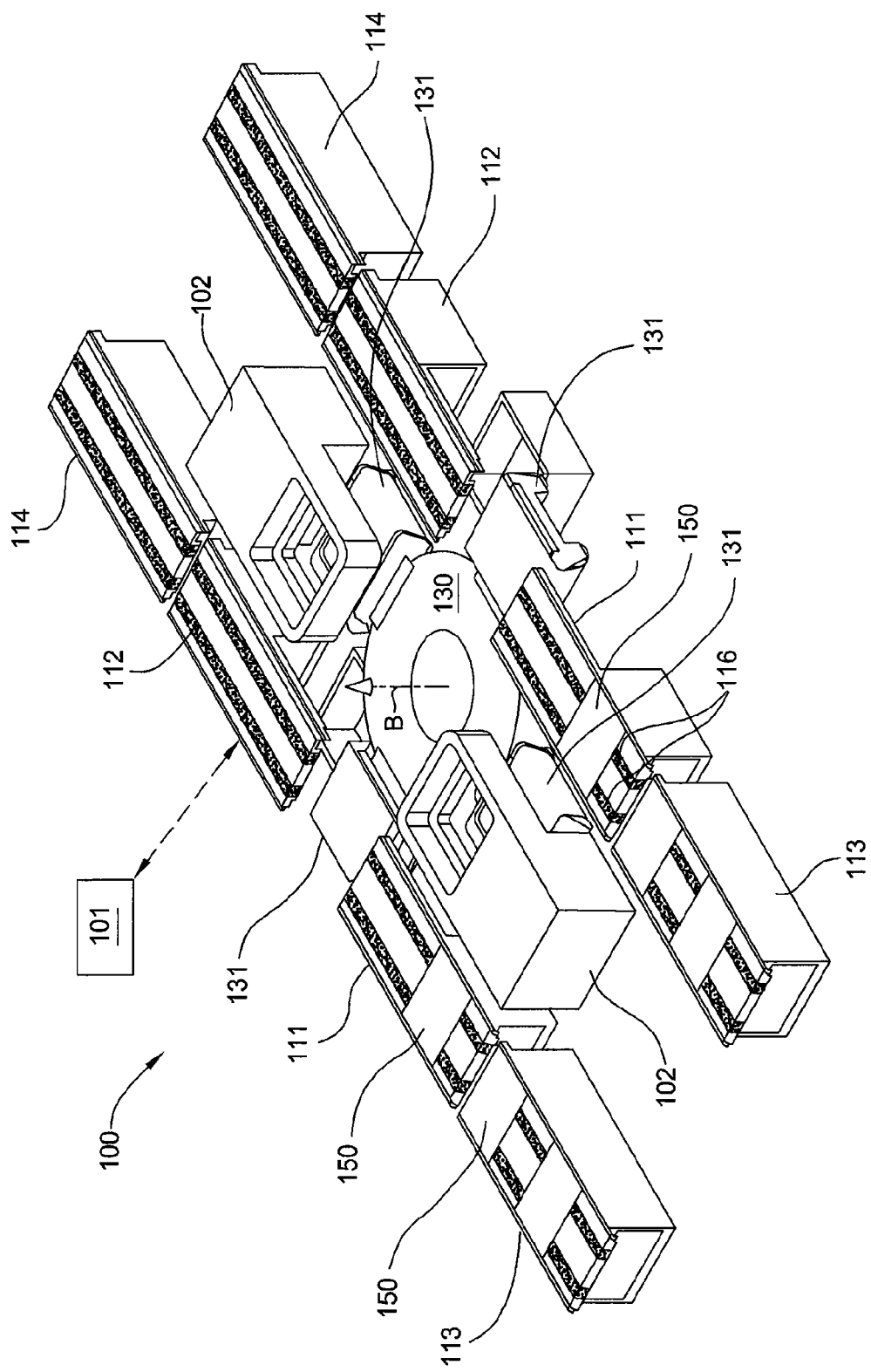
Figure 6D:
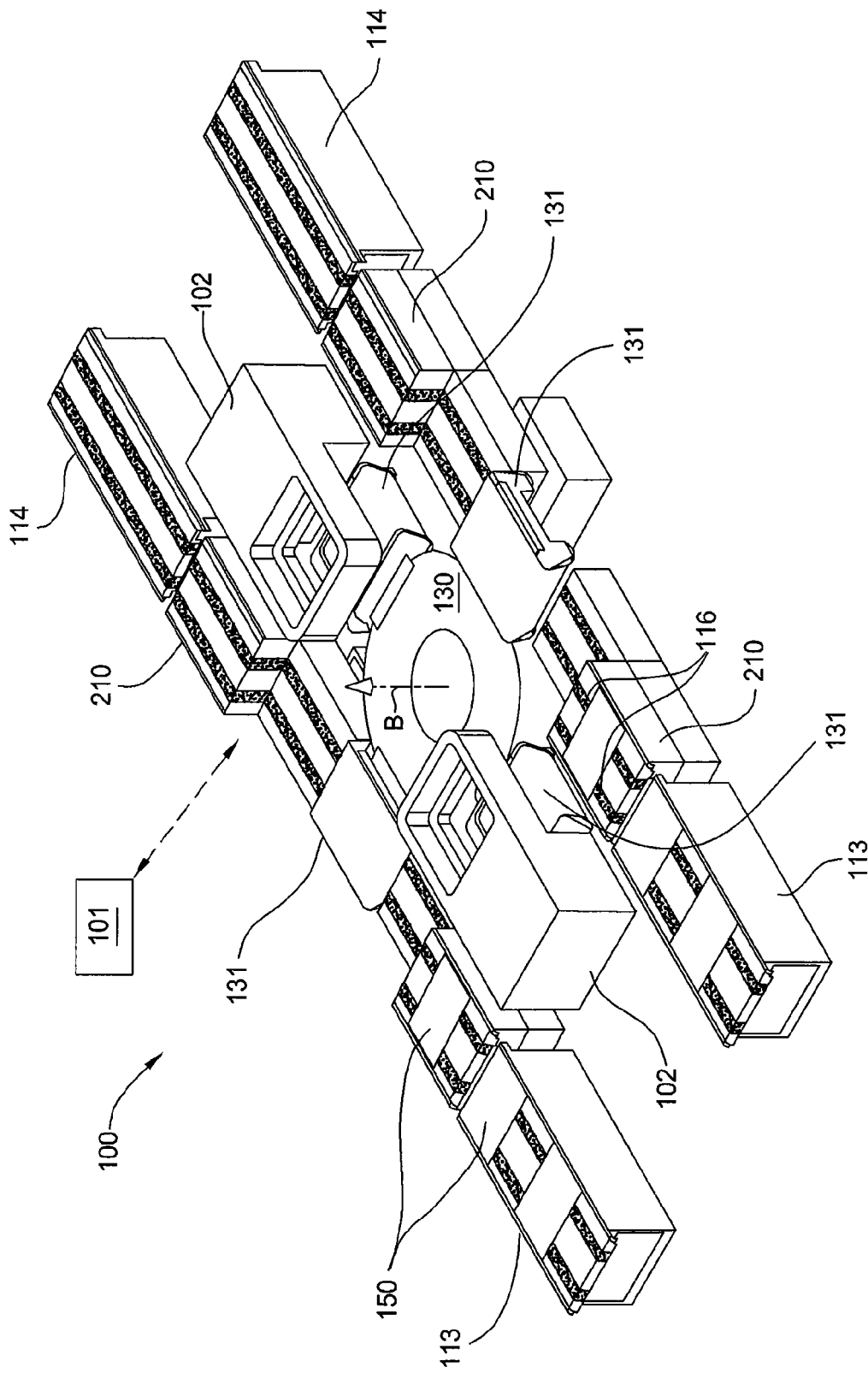

At step 510, shown in FIGS. 5, 6D, and 6DD, each of the incoming conveyors 111 and outgoing conveyors 112 are positioned so that they will not interfere with the movement of the rotary actuator assembly 130 movement performed during the next processing sequence step. In the embodiment shown in FIG. 6D, the incoming conveyors 111 and outgoing conveyors 112 are raised by use of an actuator (not shown) contained in the incoming conveyor 111 assembly and outgoing conveyors 112 assembly, and commands sent from the system controller 101. In an alternate embodiment shown in FIG. 6DD, the upper section 210 of each incoming conveyor 111 is retracted horizontally. Correspondingly, an upper section 210 of each outgoing conveyor 112 is retracted horizontally as well. With the incoming and outgoing conveyors 111, 112 in these retracted positions, the rotary actuator assembly 130 is allowed to freely rotate as shown in FIGS. 6D and 6DD.

At step 512, shown in FIGS. 5, 6D, 6DD, the rotary actuator assembly 130 is rotated so that each of the first pair of substrates are positioned within the screen print head 102 following transfer path A3 (FIG. 7). In one embodiment, as shown in FIGS. 6D, 6DD, and 7, the rotary actuator assembly 130 is rotated 90 degrees so that the substrates are positioned within the screen print head 102.

At step 514, a screen printing process is performed to deposit a desirable material on at least one surface of the first pair of substrates 150. Typically, the screen printing process will take about 2 seconds to complete. In one embodiment, to improve substrate throughput, while step 514 is being performed steps 515-523 are generally performed in parallel. One will note that the even numbered steps shown in FIG. 5 are intended to be performed on the first pair of substrates, while the odd numbered steps are intended to be performed on a second pair, and/or an alternate pair, of substrates.

At steps 515 and 517, shown in FIG. 5, a second pair of substrates 150 are received by the incoming conveyor 111 from each of the input conveyors 113 and the incoming conveyors 111 are positioned so that they can deliver the second pair of substrates 150 to the printing nests 131 similar to the processes described in steps 502 and 504 shown above and discussed in relation to FIGS. 6A-6B or FIGS. 6AA-6BB. It should be noted that some of the steps within the group of steps 515-525 may be performed simultaneously with one or more of the other steps performed during the processing sequence 500. For example, step 515 may be performed while step 512 is being performed, or step 519 may be performed while steps 515 and 517 are being performed.

One will note that during steady state substrate processing, such as when all of the printing nests have be loaded, a pair of substrates 150 will have been processed in the screen print heads 102 prior to actuating the rotary actuator assembly 130 during step 512, discussed above. Therefore, during step 519, the previously processed substrates that are positioned at the rotary actuator positions "1" and "3" (FIGS. 6E, 6EE, and 7) can now be inspected by the inspection assembly 200 to assure that there are no broken, chipped or cracked substrates, and the quality of the printing process meets some user defined standard.

Figure 6E:
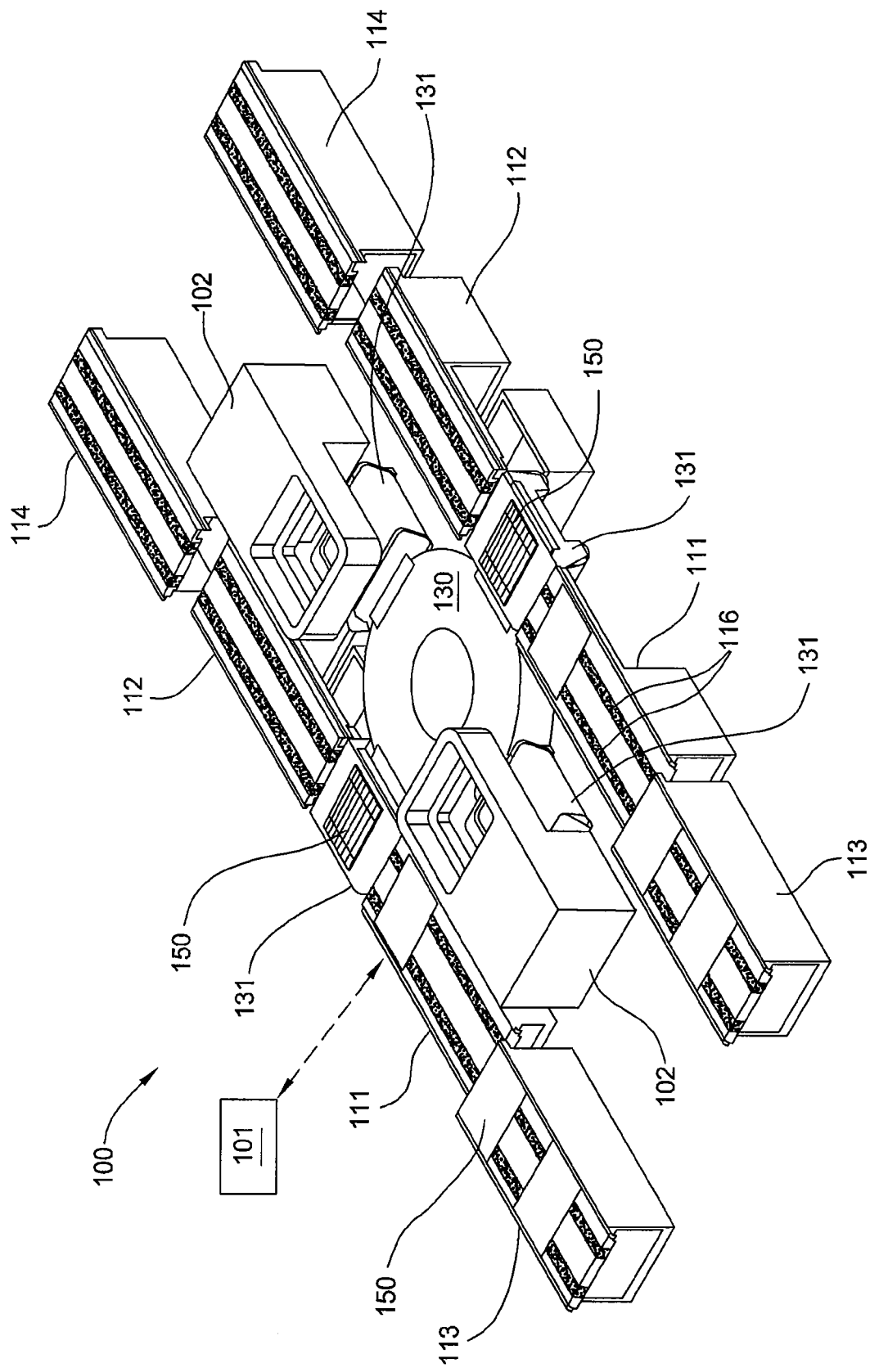
Figure 6E:
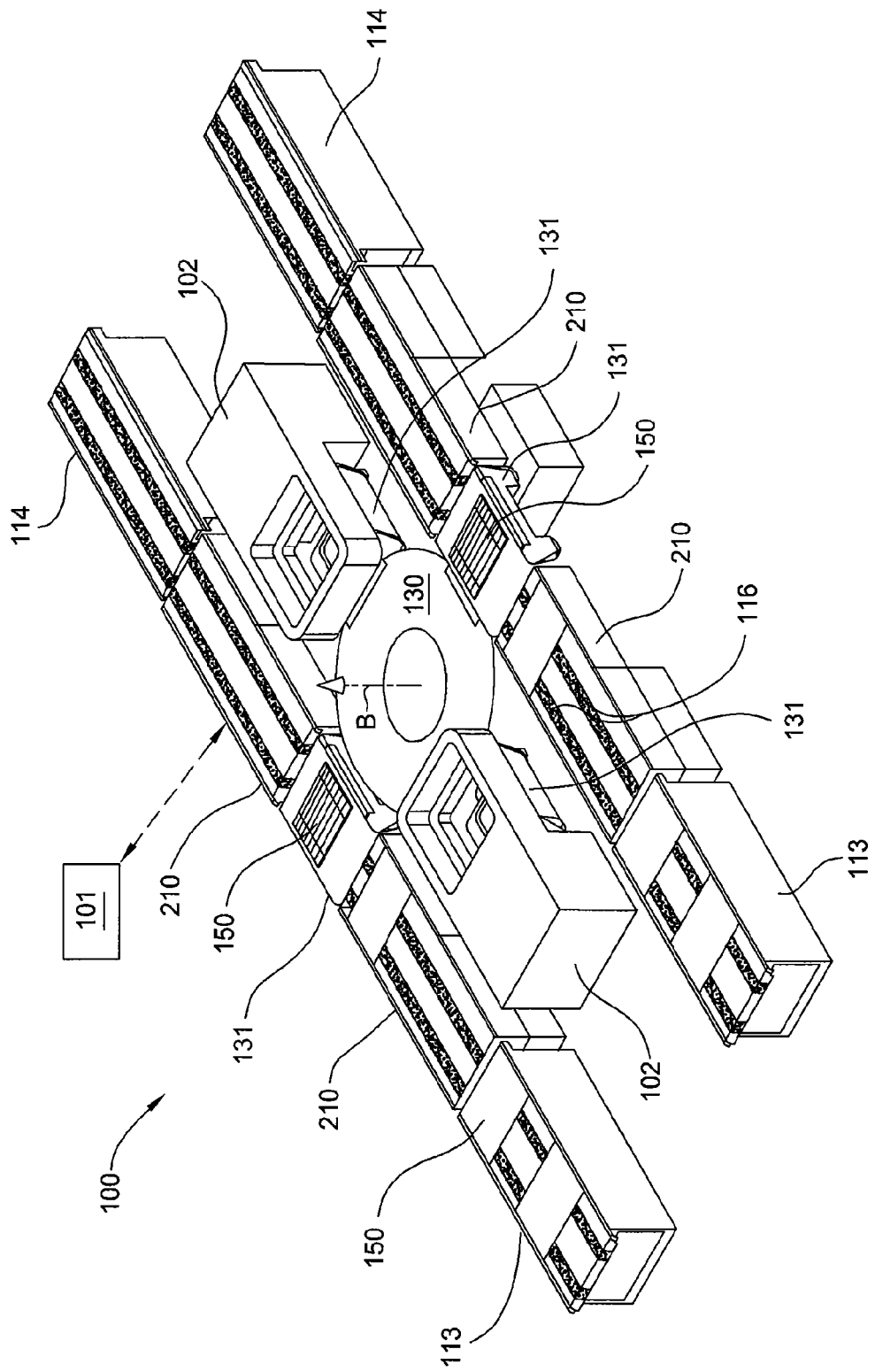
Figure 6F:
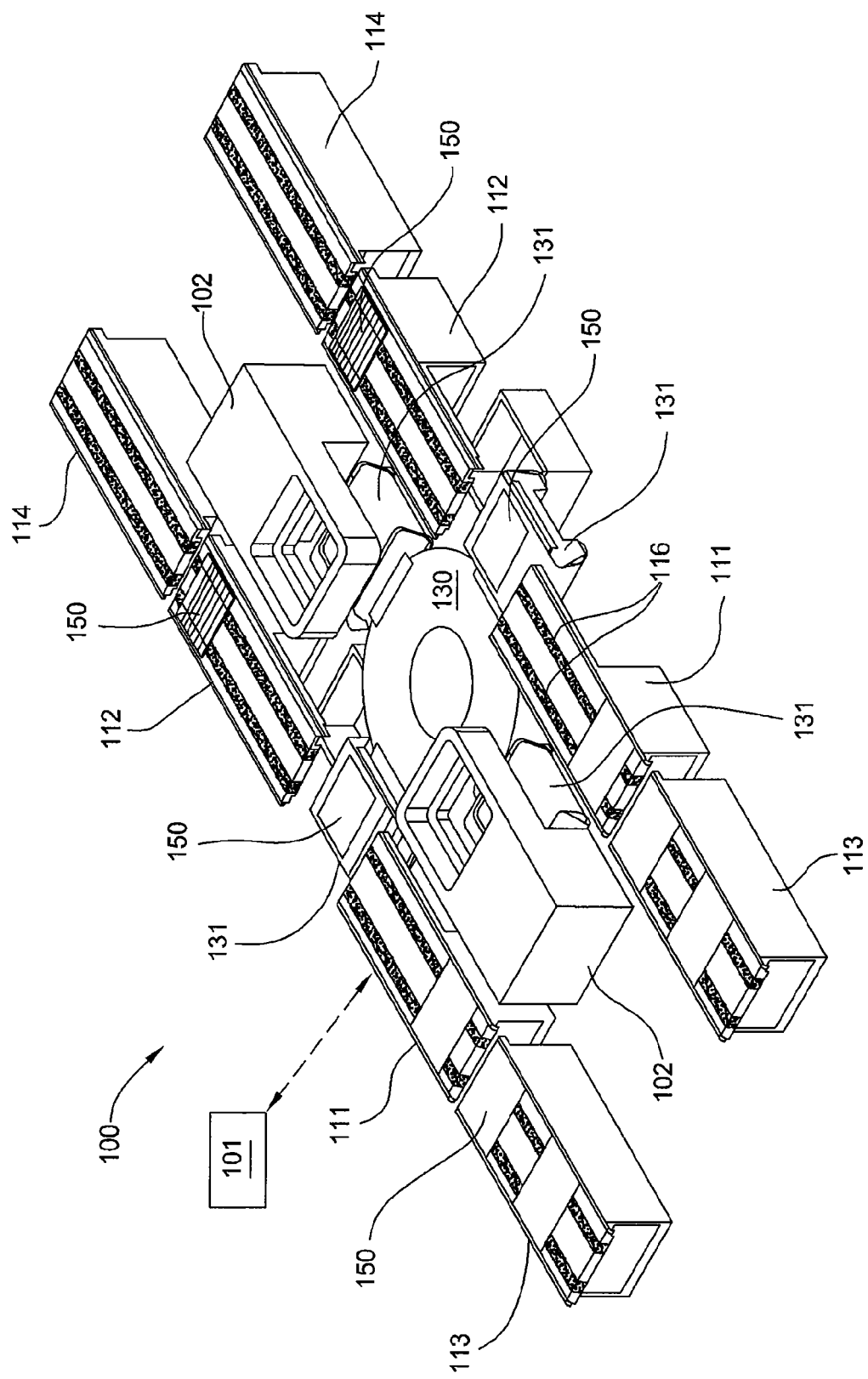
Figure 6F:
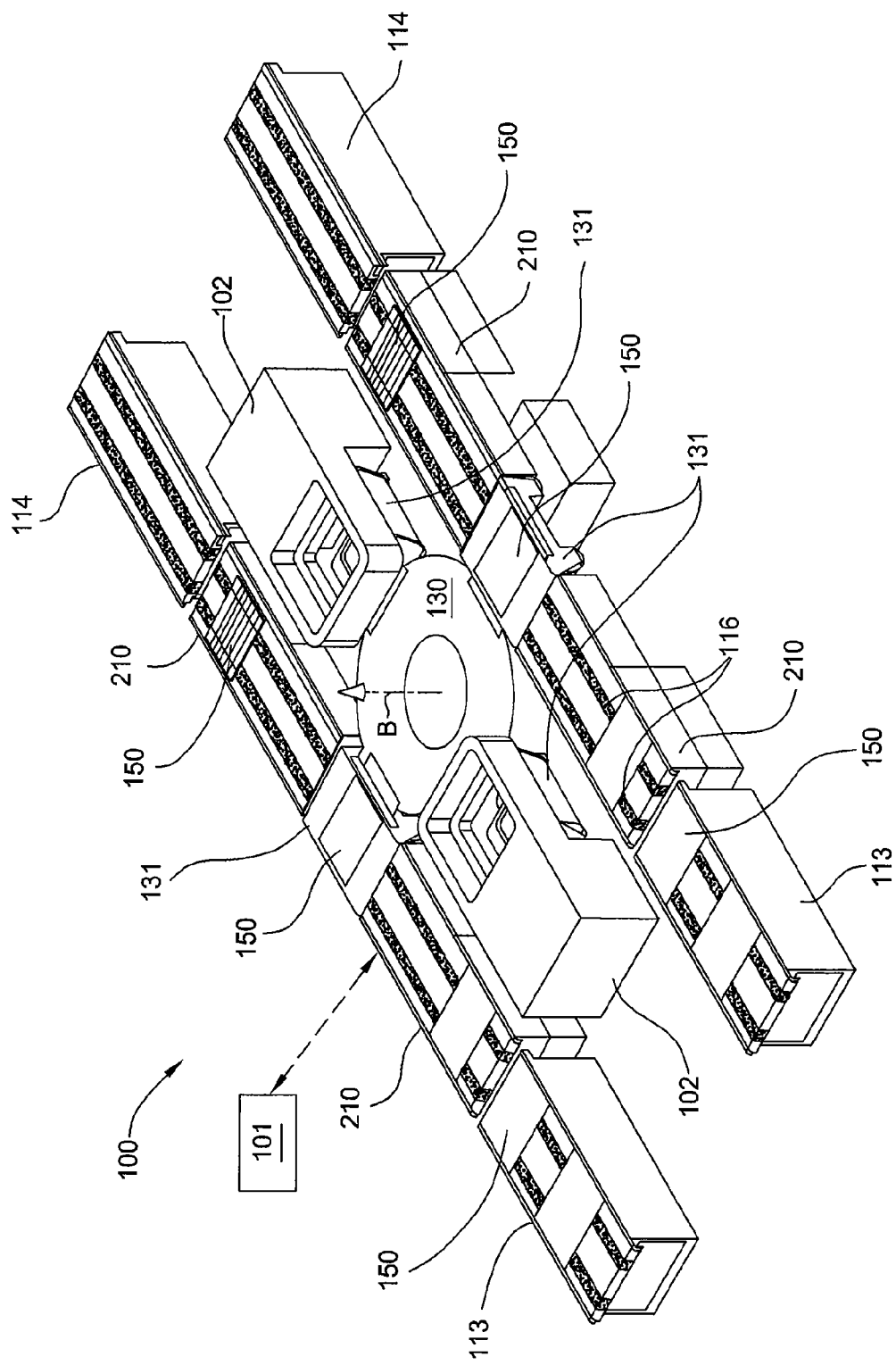

At step 521, shown in FIGS. 5, 6E, 6EE, and 7, a second pair of substrates 150 can now be transferred from each of the belt(s) 116 in the incoming conveyors 111 to the material 137 in the printing nests 131 following the transfer paths A2 (FIG. 7), as similarly discussed above in step 506.

However, during steady state processing within system 100 a pair of substrates 150 will have been processed in the screen print heads 102 prior to actuating the rotary actuator assembly 130 in step 512, thus requiring the processed substrates 150 to be removed from the printing nests 131 before the second pair of substrates 150 can be loaded onto the printing nests 131. In one embodiment, the already processed pair of substrates 150 are moved out of the printing nest 131 (i.e., transfer path A4 in FIG. 7) and the second pair of substrates are transferred into the printing nests 131 (i.e., transfer path A2 in FIG. 7) generally simultaneously. After the processed substrates are removed from the printing nests 131, the processed substrates 150 that were delivered to the outgoing conveyor 112 can then be delivered to the each of the exit conveyors 114 following the transfer paths A5 (FIG. 7). In one embodiment, depicted in FIG. 6F, after receiving a processed substrate 150, each outgoing conveyor 112 is raised to vertically align with the respective exit conveyor 114. In an alternate embodiment shown in FIG. 6FF, each outgoing conveyor 112 is already configured to deliver the already processed substrates 150 to the exit conveyors 114. The system controller 101 is used to coordinate the motion of the belt(s) 116 and drive actuators (not shown) found in each outgoing conveyor 112 and exit conveyor 114 so that the substrates can be reliably transferred between these automation components. The exit conveyor 114 can then transfer the processed substrates 150 to other parts of the production line following transfer path A6.

Figure 6G:
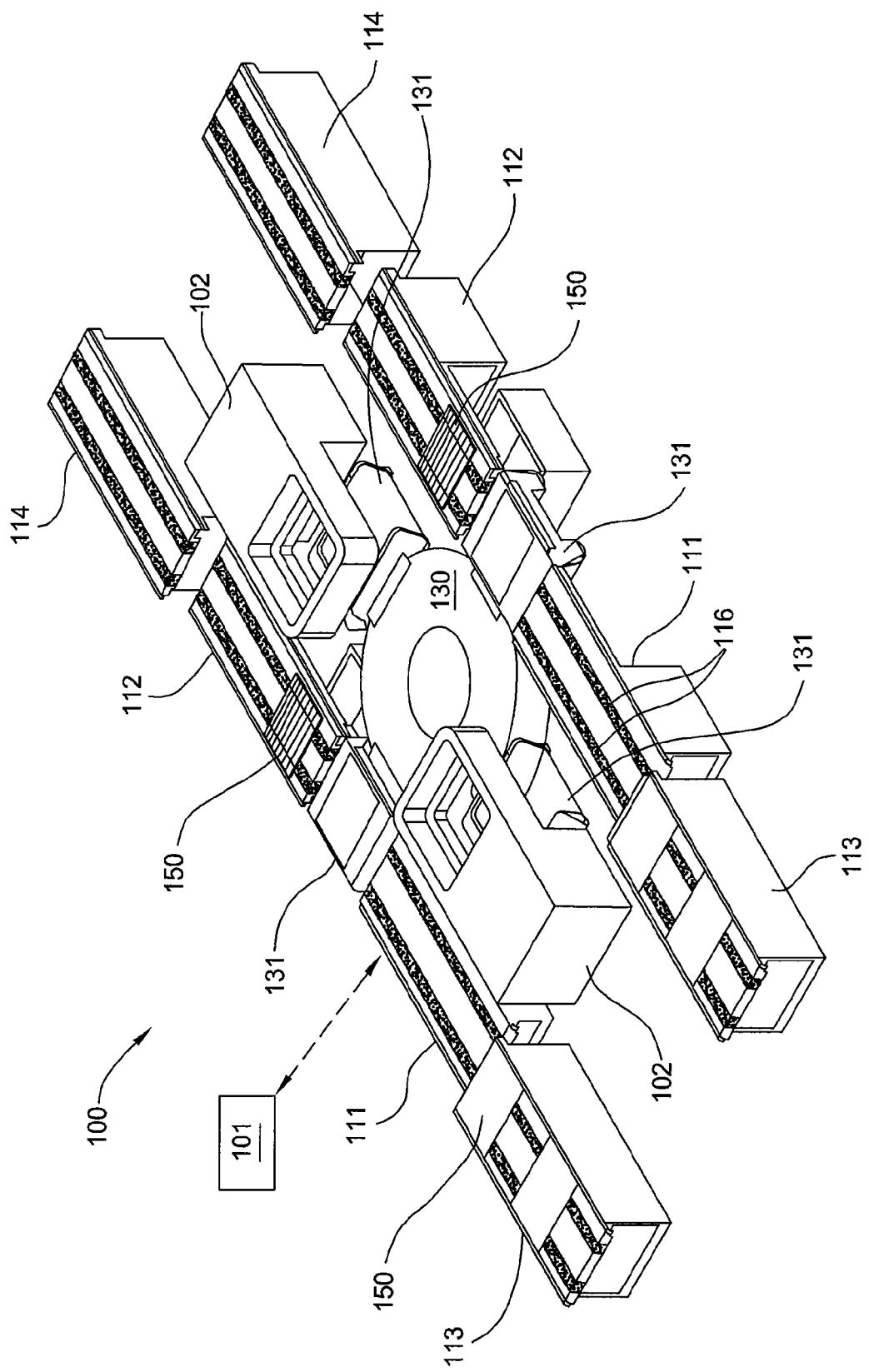
Figure 6G:
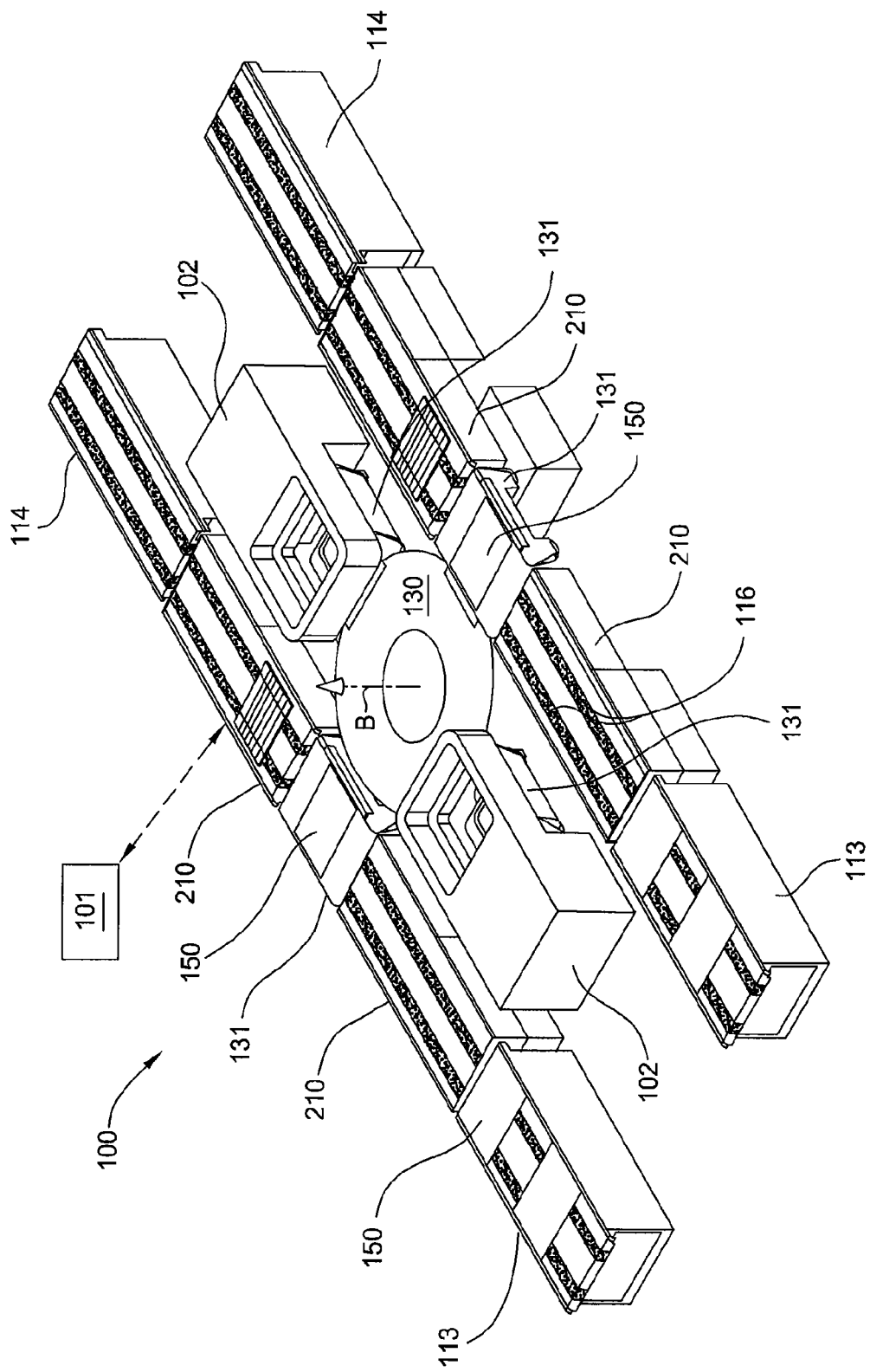

FIGS. 6G and 6GG illustrates the position of a pair of already processed substrates 150 that have been moved onto the outgoing conveyor 112, and a second pair of substrates 150 that have been transferred onto the printing nests 131. In this configuration the system controller 101 is used to coordinate the motion of the belt(s) 116 in the incoming conveyor 111, the movement of the material 137, and the motion of the belt(s) 116 in the outgoing conveyor 112 so that the substrates can be reliably transferred.

At step 523, the second pair of substrates 150 may optionally be inspected by the components in the inspection assembly 200 to ensure that there are no broken, chipped or cracked substrates positioned on the printing nests 131 and the precise position of the substrates on each of the printing nests 131 can be determined as similarly discussed in step 508, shown above.

Figure 6H:
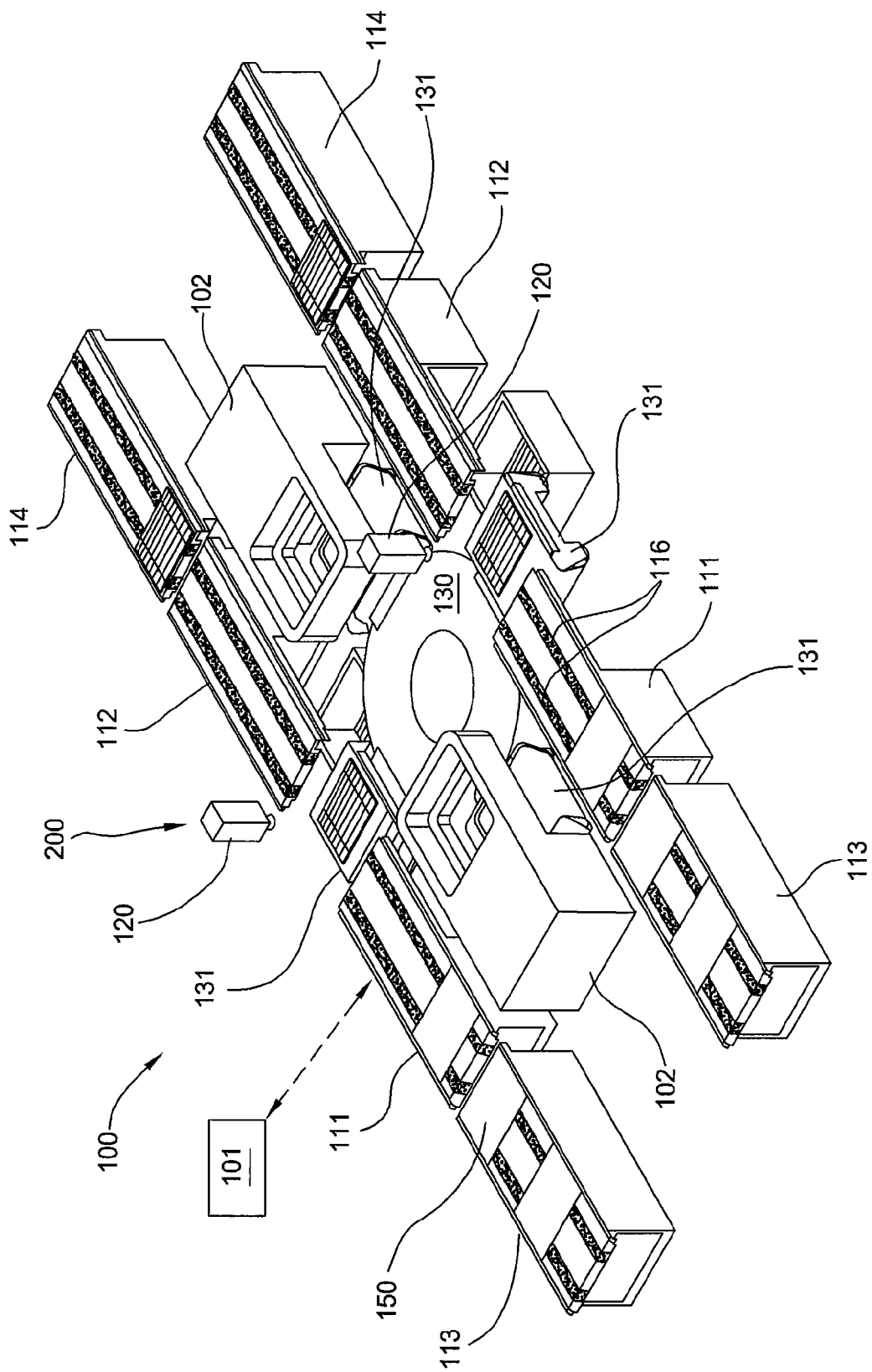
Figure 6H:
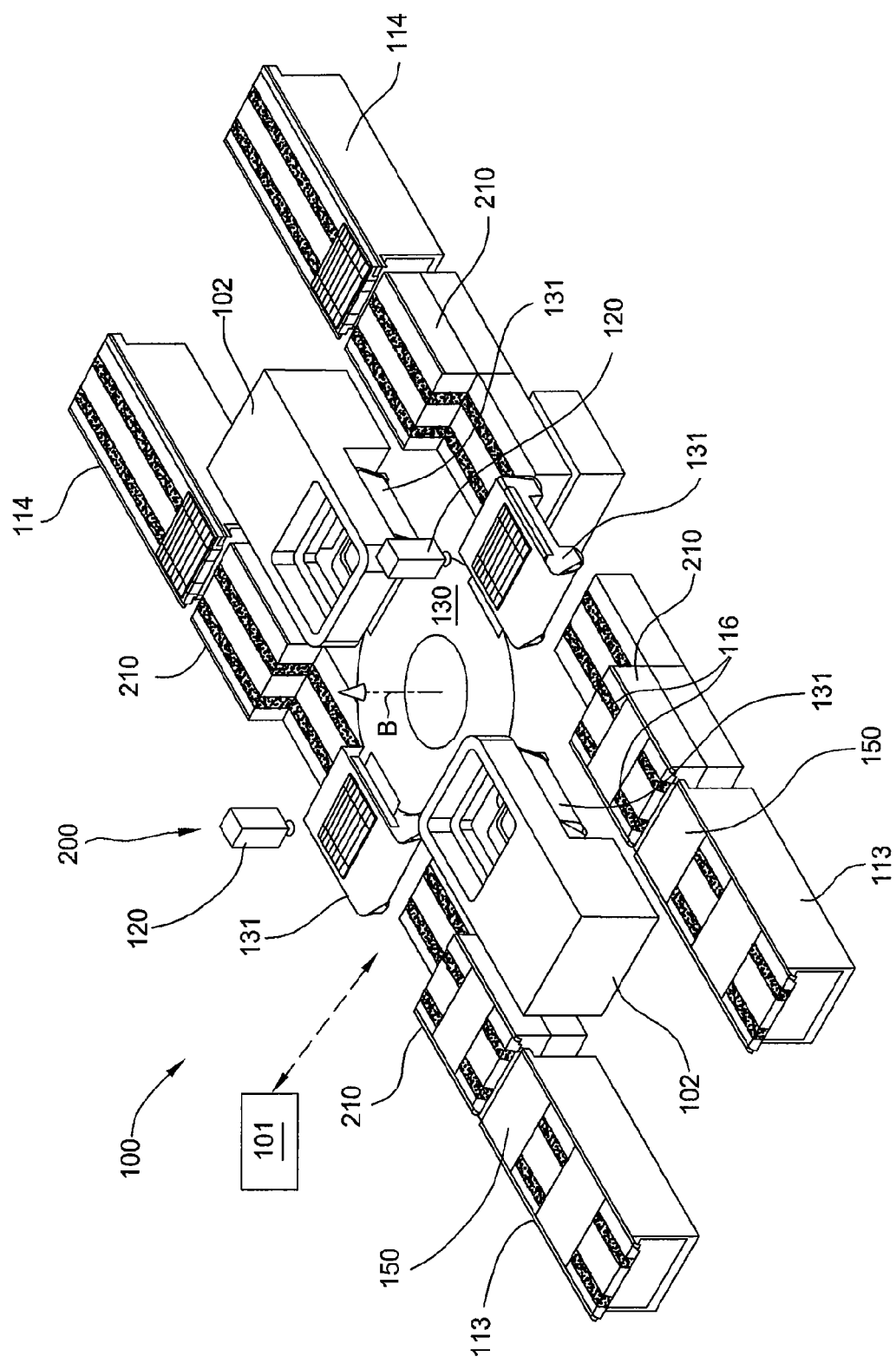

At step 525, shown in FIGS. 5, 6H, and 6HH, each of the incoming conveyors 111 and outgoing conveyors 112 are positioned so that they will not interfere with the movement of the rotary actuator assembly 130 during the next processing sequence step. In the embodiment shown in FIG. 6H, the incoming conveyors 111 and outgoing conveyors 112 are raised by use of an actuator (not shown) contained in the incoming conveyors 111 and outgoing conveyors 112, and commands sent from the system controller 101. In an alternate embodiment shown in FIG. 6HH, the upper sections 210 of the incoming conveyor 111 are retracted horizontally away from the printing nests 131, and the upper sections 210 of the outgoing conveyors 112 are retracted away from the printing nests 131 as well. In one embodiment, the system controller 101 sends commands for controlling the retraction of the upper sections 210 of the incoming and outgoing conveyors 111, 112.

At step 526, shown in FIGS. 5 and 7, the rotary actuator assembly 130 is rotated so that each of the second pair of substrates are positioned within the screen print head 102 following transfer path A3 (FIG. 7) and the first pair of substrates are positioned at the rotary actuator positions "1" and "3" following transfer path A7 (FIGS. 6E, 6EE, and 7). In one embodiment, as shown in FIGS. 6D, 6DD, and 7, the rotary actuator assembly 130 is rotated about 90 degrees during step 526.

After step 526 is completed then steps 514 through 526 can be repeated over and over again depending on how many substrates are to be processed in the system 100. It should be noted that the number and sequence of steps illustrated in FIG. 5 is not intended to limit the scope of the invention described herein, since one or more steps can be deleted and/or reordered without deviating from the basic scope of the invention described herein. Also, the schematic representation of the steps shown in FIG. 5 is not intended to limit the scope of the invention described herein, since the steps need not be completed in a sequential fashion as pictorially shown, and two or more of the steps can be completed simultaneously.

Figure 8A:
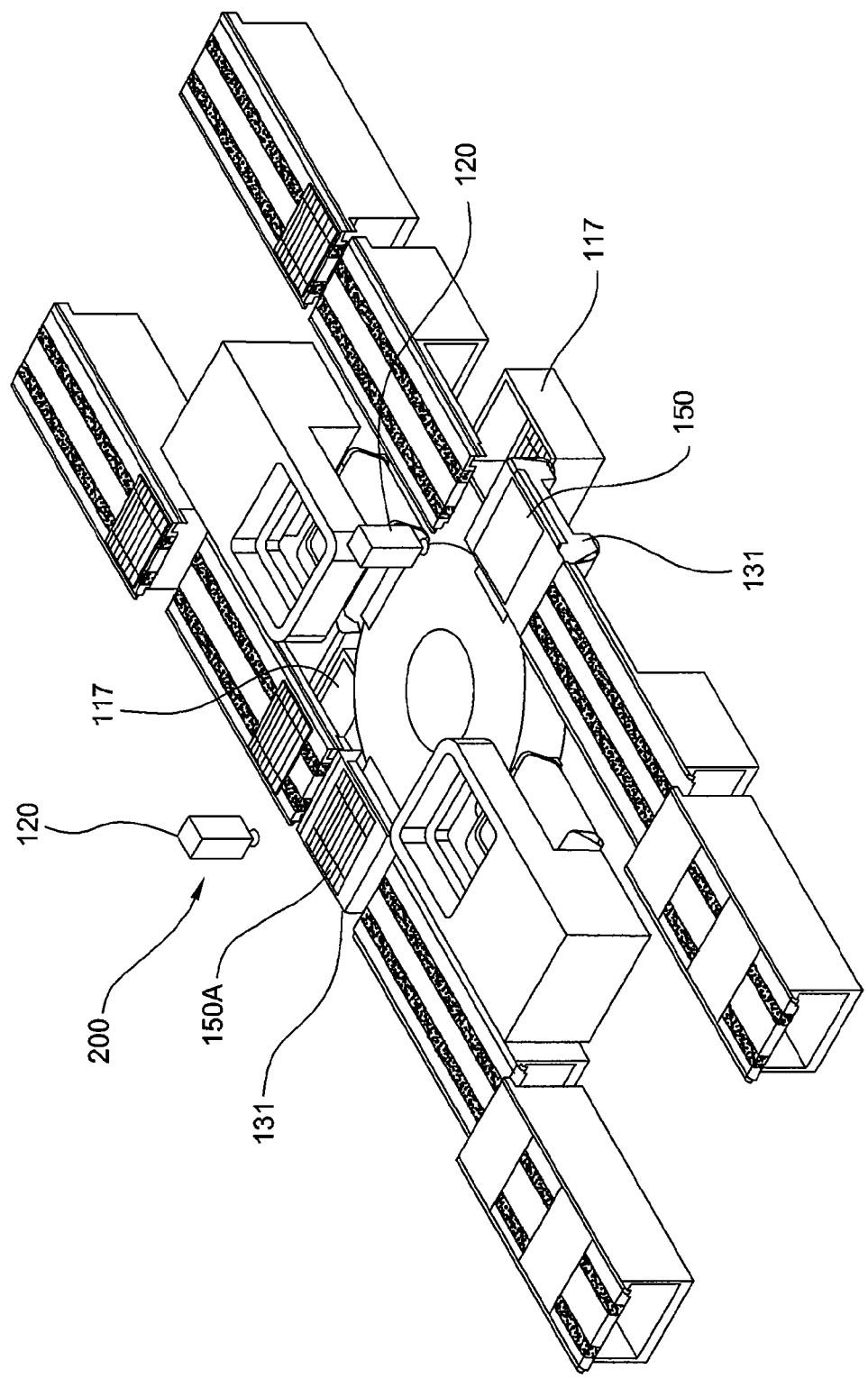
FIGS. 8A-8B illustrate schematic isometric views of the components in the screen printing system during different stages of a substrate processing sequence according to one embodiment of the invention.
Figure 8B:
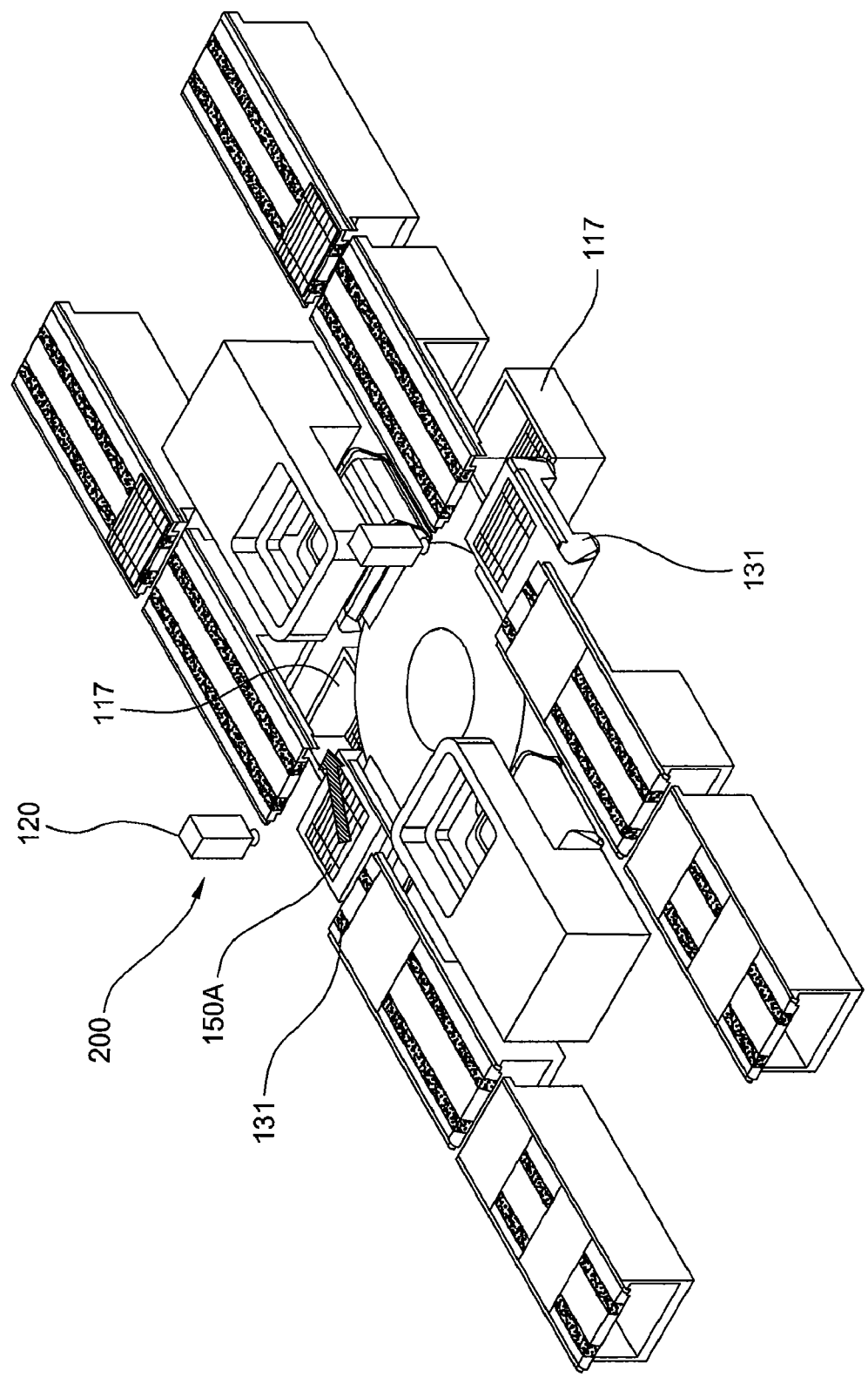

In cases where a broken or defective substrate is detected by the inspection assembly 200, the substrate may be deposited into a waste collection device 117 (FIG. 1) so that the substrate is removed from the process flow and thus will not damage or affect other down stream processes. Referring to FIGS. 8A and 8B a defective substrate 150A that is positioned on one of a printing nest 131 needs to be moved to the waste collection device 117. In one embodiment, to remove the defective substrate 150A the outgoing conveyor 112 is raised (FIG. 8B) and the defective substrate is moved to one of the waste collection devices 117 from the printing nest 131 by movement of the material 137 in the affected printing nest 131 from commands sent from the system controller 101. In an alternate embodiment, the upper section 210 can be retracted to allow the detective substrate to be transferred from the printing nest 131 to the waste collection device 117.

Incoming and Outgoing Conveyor Configuration

In the embodiments depicted in FIGS. 6AA-6HH, the incoming and outgoing conveyors 111, 112 are configured such that their respective upper sections 210 extend horizontally to receive and dispense the substrates 150 to and from the printing nests 131 and retract horizontally to allow free rotation of rotary actuator assembly 130. FIGS. 9A and 9B are simplified, schematic, cross-sectional views of an incoming conveyor 111 according to one embodiment of the present invention. Although the following description refers to the incoming conveyor 111, it applies equally to the outgoing conveyor 112, which may be identical to the incoming conveyor.

In one embodiment as depicted in FIGS. 9A and 9B, the incoming conveyor 111 comprises an upper section 210 and a lower section 220 with a stationary pinion gear 230 disposed therebetween. The stationary pinion gear 230 is driven by a pinion gear motor 240 for horizontally extending and retracting the upper and lower sections 210, 220 of the incoming conveyor 111 simultaneously. The upper section 210 may be a structural rack having an upper surface 212 configured to support one or more belts 116 thereon. A lower portion 214 of the upper section 210 may be configured with gear teeth matching that of the stationary pinion gear 230. Correspondingly, the lower section 220 may be a structural rack having an upper portion 224 configured with gear teeth matching that of the stationary pinion gear 230 and a lower surface 222 configured to guide the one or more belts 116 thereon.

In one embodiment, the upper section 210 includes an upper roller 216 attached at one end. An upper roller 217 is configured at the opposite end and is configured to remain stationary as the upper section 210 is extended and retracted. Each of the upper rollers 216, 217 may be configured to freely rotate and guide the belt(s) 116 over the upper surface 212 of the upper section 210. Accordingly, the lower section 220 may include a lower roller 226 attached at one end as well. The lower roller 226 may also be configured to freely rotate and guide the belt(s) 116 onto the lower surface 222 of the lower section 220.

In one embodiment, the incoming conveyor 111 includes one or more driver rollers 250 driven by a conveyor belt motor 260 to drive and guide the one or more belts 116 for transporting the substrate 150. In one embodiment, the incoming conveyor 111 includes one or more idler rollers 270 for guiding and tensioning the one or more belts 116. In addition, the incoming conveyor 111 may include one or more additional free wheeling rollers 280 for guiding the one or more belts 116 as needed for particular configurations and sizes of the incoming conveyor 111.

In operation, the incoming conveyor 111 may first be positioned in its retracted position as shown in FIG. 9A. As previously described, when the incoming conveyor 111 is in its retracted position (and the outgoing conveyor 112 in its retracted position), the rotary actuator assembly 130 is allowed to freely rotate the printing nests 131 about the B-axis (FIGS. 6AA-6HH). The substrate 150 may be transferred from the input conveyor 113 onto the incoming conveyor 111. At this point, the incoming conveyor 111 may be extended from its retracted position as shown in FIG. 9A to its extended position as shown in FIG. 9B for dispensing the substrate 150 onto the printing nest 131.

In one embodiment, the following operations occur in order to complete the extension of the upper section 210 from its retracted position to its extended position. The system controller 101 may send signals to the pinion gear motor 240 to drive the pinion gear 230 rotationally in the "C" direction. As the pinion gear 230 rotates, the upper section 210 is horizontally extended in the "X" direction, and the lower section 220 is simultaneously retracted in the "Y" direction. In one embodiment, the system controller 101, substantially simultaneously sends signals to the conveyor belt motor 260 to rotate the one or more driver rollers 250 in the "F" direction for driving the one or more belts 116. Driving the belt(s) 116 and translating the upper section 210 substantially simultaneously allows the substrate 150 to be quickly moved from a receiving position (FIG. 9A) to a dispensing position (FIG. 9B). In order to retract the upper section 210 of the incoming conveyor from its extended position to its retracted position, the preceding operations are substantially reversed except for the rotational direction of the driver roller(s) 250, which may remain the same at all times.

As previously described, the composition and operation of the outgoing conveyor 112 is substantially the same as that of the incoming conveyor 111.

Alternate Conveyor Screen Printing System Configuration

Figure 10:
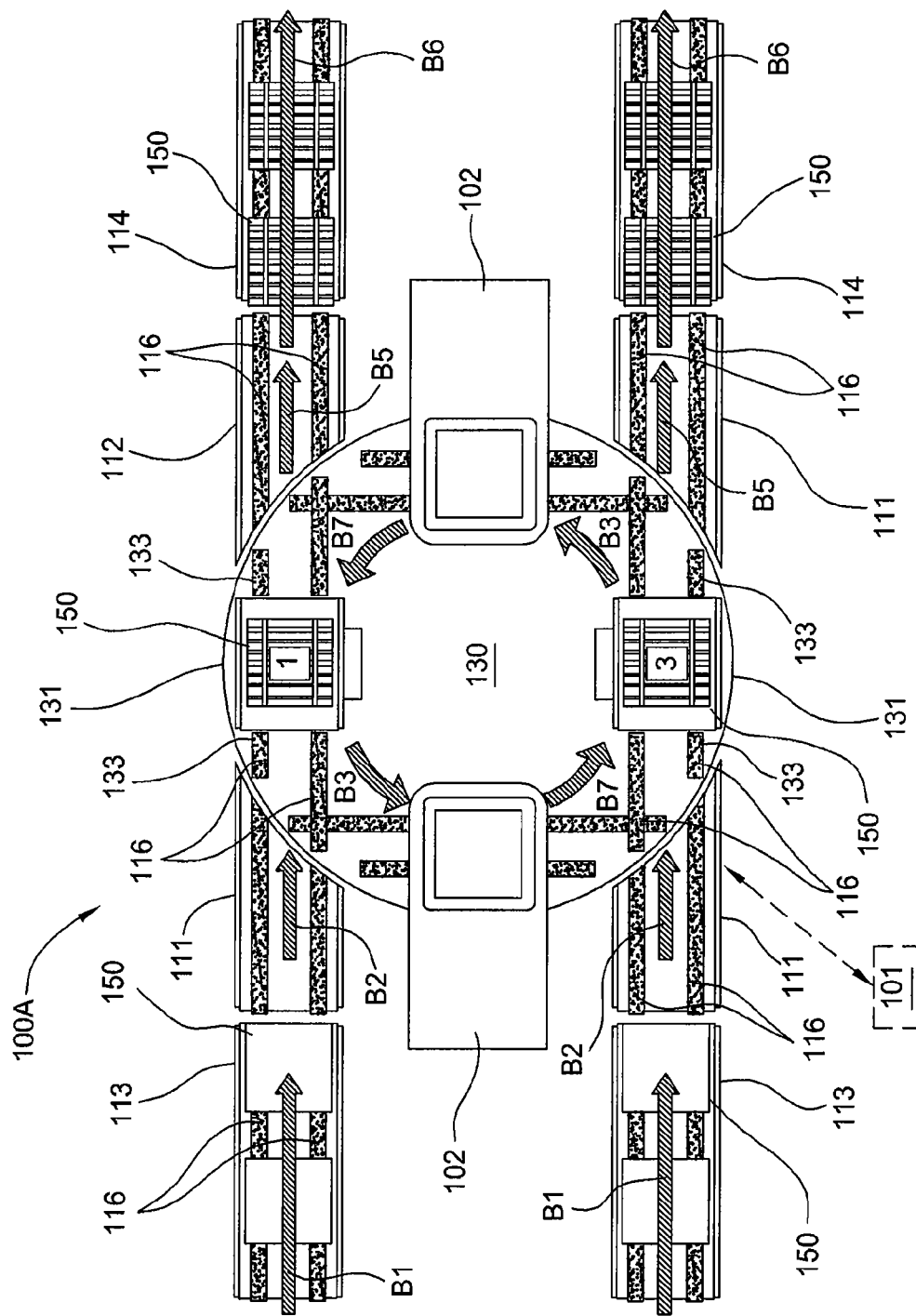
FIG. 10 is a plan view of an alternate configuration of a screen printing system according to one embodiment of the invention.

FIG. 10 illustrates another embodiment of the system 100, or system 100A, in which the incoming conveyors 111 and outgoing conveyors 112 are shaped so that the position of the incoming conveyor 111 and the outgoing conveyors 112 do not need to be moved relative to the printing nests 131 to allow the rotary actuator assembly 130 to be rotated between the various positions "1" through "4". This configuration can thus reduce the transfer sequence time and reduce the cost of the incoming conveyor 111 and outgoing conveyors 112.

Referring to FIG. 10, the system 100A generally includes two incoming conveyors 111, rotary actuator assembly 130, two screen print heads 102, two outgoing conveyors 112, and four pairs of supporting conveyors 133 that are attached to and rotate with the rotary actuator assembly 130. The system 100A generally utilizes two incoming conveyors 111 that are configured in a parallel processing configuration so that each incoming conveyor 111 can receive substrates from an input conveyor 113 and transfer the substrate to a printing nest 131 coupled to the rotary actuator assembly 130 using the belts 116 in the incoming conveyor 111 and belts in the supporting conveyors 133. Also, each of the outgoing conveyors 112 are generally adapted to receive processed substrates from the printing nest 131 and transfer each of the processed substrates to the exit conveyor 114 by use of a belt in a supporting conveyor 133 and belts 116 in the incoming conveyor 111.

The processing sequence steps used to transfer substrates through system 100A are similar to the steps shown in FIG. 5. The major differences include the feature that system 100A does not require the incoming or outgoing conveyors 111, 112 to change position to align the conveyors with the printing nests 131 or move the conveyors so that they do not interfere with the movement of the rotary actuator assembly 130. In this case, steps 504, 510, 517 and 525 found in the processing sequence 500 used in conjunction with the system 100 are generally not required. The other major processing sequence differences also include the added requirement that the system controller 101 also control the supporting conveyor 133 movement along with the movement of the belts in the incoming conveyor 111 and material 137 in the printing nests 131 during the loading steps (i.e., steps 506 and 521), and also the movement of supporting conveyor 133 and movement of the belts in the outgoing conveyor 112 and material 137 in the printing nests 131 during the unloading steps (i.e., step 521). In one example, the substrate transfer path through the system 100 generally follows the paths B1-B7.

Alternate Screen Printing System Configuration

Figure 11:
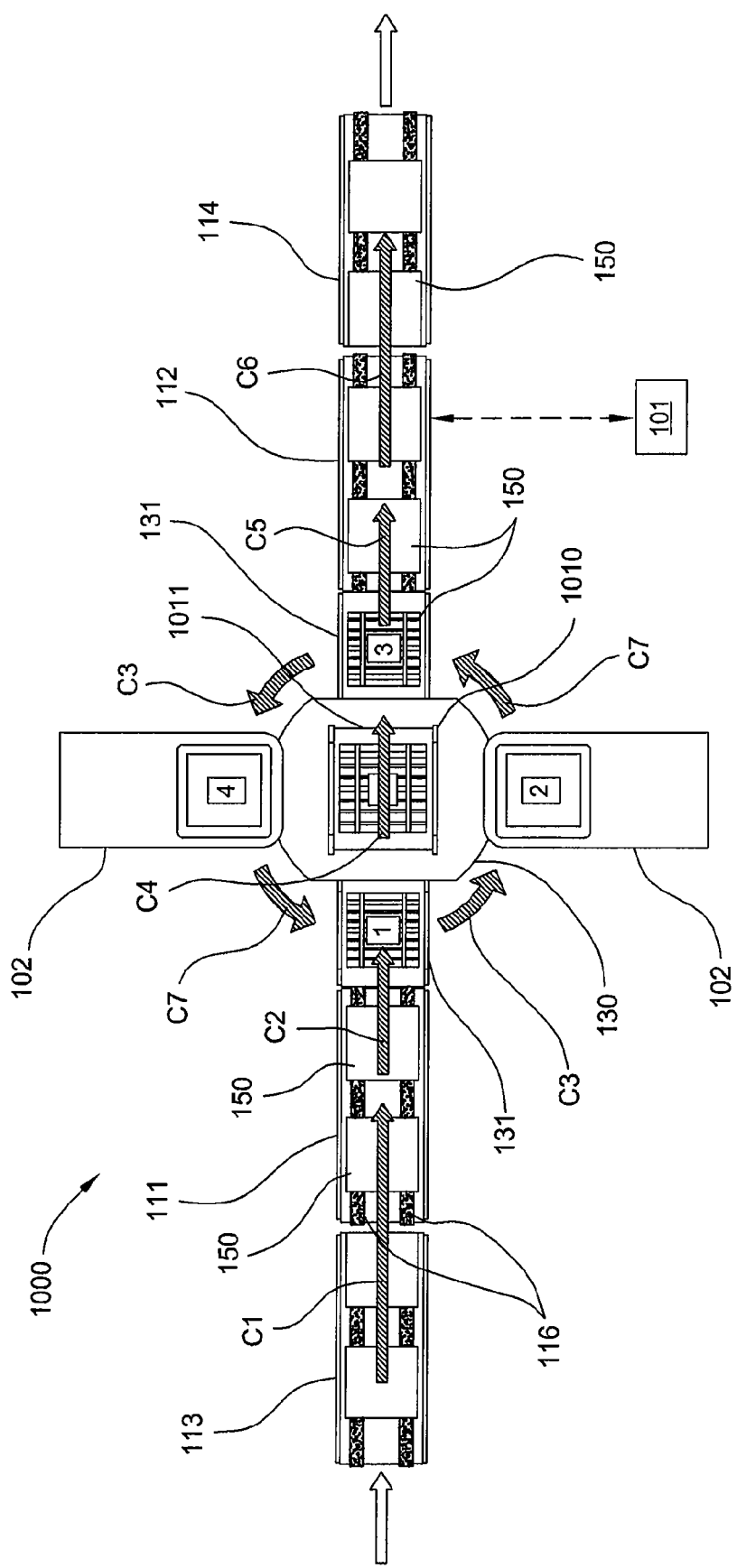
FIG. 11 is a plan view of another alternate configuration of a screen printing system according to one embodiment of the invention.

FIG. 11 illustrates an alternate configuration of a multi-screen printing chamber processing system, or system 1000, that may be used in conjunction with various embodiments of this invention described herein. The system 1000 is similar to the system 100 configurations discussed above, except that a single incoming conveyor 111 and outgoing conveyor 112 are used to deliver substrates to the rotary actuator assembly 130 and pair of screen print heads 102. Removal of an incoming conveyor 111, an outgoing conveyor 112 may reduce the total system cost. To facilitate the understanding of FIG. 11, identical reference numerals found in FIGS. 1-10 have been used, where possible, to designate identical elements that are common. In the configuration shown in FIG. 11, the printing nests 131 are oriented such that the direction of substrate movement on the nest is radially oriented relative to the rotary actuator assembly 130.

In one embodiment, the system 1000 contains one incoming conveyor 111, a rotary actuator assembly 130, two screen print heads 102, a central conveyor assembly 1010, and one outgoing conveyor 112. The system 1000 generally utilizes one incoming conveyor 111 to deliver substrates to a printing nest 131 positioned in position "1" (FIG. 11) and the outgoing conveyor 112 to remove substrates from a printing nest 131 positioned in position "3". The movement of substrates between input conveyor 113, incoming conveyor 111, printing nests 131, outgoing conveyors 112 and exit conveyor 114 are similar to the motions discussed above. However, the system 1000 has advantages over the processing sequences discussed above, since the incoming conveyor 111 and outgoing conveyors 112 do not need to be moved relative to the printing nests 131 to allow the rotary actuator assembly 130 to be rotated between the various positions "1" to "4". This configuration can thus reduce the transfer sequence time and reduce the cost of the incoming conveyor 111 and outgoing conveyors 112.

The central conveyor assembly 1010 is generally a conveyor, or similar robotic device, that is able to transfer substrates 150 across the rotary actuator assembly 130 to the opposing printing nest so that the substrate can be transferred to the opposing printing nest, the outgoing conveyor, and/or the exit conveyors. In one embodiment, the central conveyor assembly 1010 is adapted to transfer substrates from the printing nest positioned at position "1" to the printing nest positioned in position "3" by the cooperative movement of the material 137 in the printing nests positioned in positions "1" and "3" and movement of a belt 1011 in the central conveyor assembly 1010. In one embodiment, the central conveyor assembly 1010 comprises two sets of rollers or belts that are adapted to rotate with the rotary actuator assembly 130 and thus are fixedly aligned with each pair of opposing printing nests 131. In another embodiment, the central conveyor assembly 1010 remains stationary and is aligned so that substrates can only be transferred from the printing nest positioned position "1" to the printing nest positioned in position "3".

Figure 12:
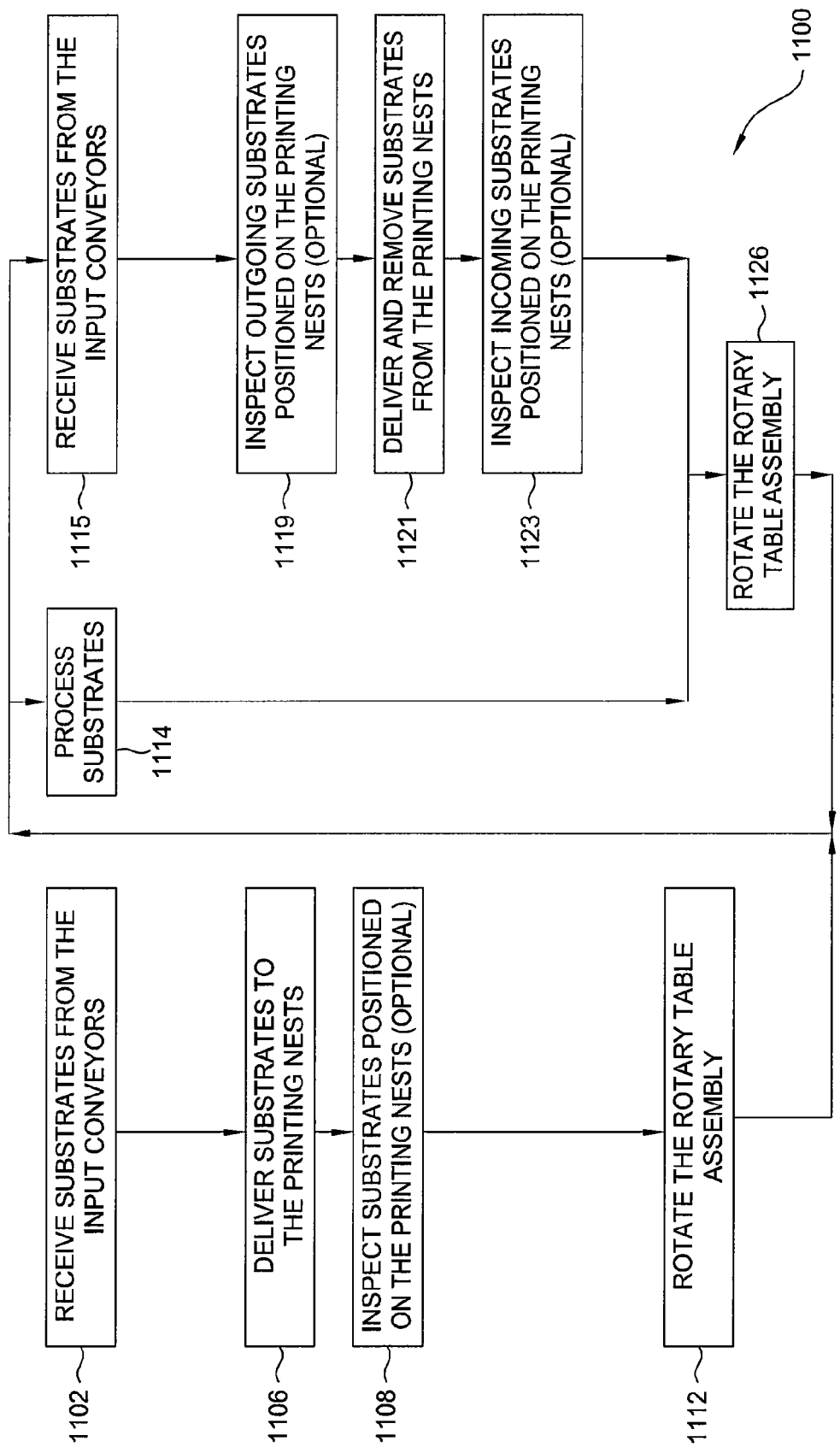
FIG. 12 illustrates a flow chart of a substrate processing sequence according to one embodiment of the invention.

FIG. 12 illustrates one example of a substrate processing sequence 1100 through the system 1000. FIG. 12 illustrates an example of the transfer steps that a substrate may follow as it is transferred through the system 1000 following the processing sequence 1100 described in FIG. 12. Steps 1102-1112 illustrate the main initial processing sequence steps for the first pair of substrates and steps 1114-1126 illustrate the steps commonly performed while the system 1000 is loaded and running.

At step 1102, shown in FIGS. 11 and 12, a first pair of substrates 150 are received from the input conveyors 113 by the incoming conveyor 111 following the transfer paths C1 (FIG. 11). In this configuration the system controller 101 is used to coordinate the motion of the belt(s) 116 and drive actuators (not shown) found in the input conveyor 113 and incoming conveyor 111 so that the substrates can be reliably transferred between these automation components.

At step 1106, shown in FIGS. 11 and 12, the first pair of substrates 150 are transferred from the belt(s) 116 in the incoming conveyor 111 to the material 137 in the printing nests 131 following the transfer paths C2 and C4 (FIG. 11). In this configuration the system controller 101 is used to coordinate the motion of the belt(s) 116 in the incoming conveyor 111, the material 137 in the printing nest 131 positioned in position "1", the belt 1011 in the central conveyor assembly 1010, and the material 137 in the printing nest 131 positioned in position "3" so that one substrate can be positioned in each of the printing nests positioned at positions "1" and "3". In one embodiment, the substrates received from the incoming conveyor 111 are spaced a desired distance apart (i.e., distance between printing nests 131 positioned in positions "1" and "3") to allow the speed of all of the automation components to remain constant so that the substrates can be easily positioned in their respective printing nest at roughly the same time.

At step 1108, the first pair of substrates 150 may optionally be inspected by the components in the inspection assembly 200 to assure that there are no broken, chipped or cracked substrates positioned on the printing nests 131. The inspection assemblies can also be used to determine the precise position of the substrates on each of the printing nests 131. The location data of each substrate 150 on each printing nest 131 can be used by the system controller 101 to position and orient the screen print head components in the screen print head 102, so that the subsequent screen printing process can be accurately positioned on each of the substrates 150. In this case the position of each of the print heads can be automatically adjusted to align to the screen print head 102 to the exact position of the substrate positioned on the printing nest based on the data received during the inspection process performed during step 1108.

At step 1112, shown in FIGS. 11 and 12, the rotary actuator assembly 130 is rotated so that each of the first pair of substrates are positioned within the screen print head 102 following transfer path A3 (FIG. 10). In one embodiment, as shown in FIG. 10, the rotary actuator assembly 130 is rotated 90 degrees so that the substrates are positioned within the screen print head 102.

At step 1114, a screen printing process is performed to deposit a desirable material on at least one surface of the first pair of substrates 150. In one embodiment, to improve substrate throughput, while step 1114 is being performed steps 1115-1123 are generally performed in parallel. One will note that the even numbered steps are intended to be performed on the first pair of substrates while the odd numbered steps are intended to be performed on a second pair, and/or an alternate pair, of substrates.

At step 1115, shown in FIG. 12, a second pair of substrates 150 are received by the incoming conveyor 111 from the input conveyor 113 and the incoming conveyor 111 are positioned so that they can deliver the second pair of substrates 150 to the printing nests 131 similar to the processes described in steps 1102, shown above. It should be noted that some of the steps within the group of steps 1115-1123 may be performed simultaneously with one or more steps performed during the processing sequence 1100. For example, step 1115 may be performed while step 1112 is being performed or step 1119 may be performed while step 1115 is being performed.

One will note that during steady state substrate processing within system 1000, such as when all of the printing nests have be loaded, a pair of substrates will have been processed in the screen print heads 102 prior to actuating the rotary actuator assembly 130 during step 1112, discussed above. Therefore, during step 1119, these processed substrates that are positioned in the printing nests 131 at the rotary actuator positions "1" and "3" (FIG. 11) can now be inspected by the components in the inspection assembly 200 to assure that there are no broken, chipped or cracked substrates and the quality of the printing process can monitored.

At step 1121, shown in FIGS. 11 and 12, a second pair of substrates 150 can now be transferred from each of the belt(s) 116 in the incoming conveyors 111 to the material 137 in the printing nests 131 following the transfer paths C2 and C4 (FIG. 7), as similarly discussed above in step 506. In this configuration the system controller 101 is used to coordinate the motion of the belt(s) 116 in the incoming conveyor 111, the material 137 in the printing nest 131 positioned in position "1", the belt 1011 in the central conveyor assembly 1010, and the material 137 in the printing nest 131 positioned in position "3" so that one substrate can be positioned in each of the printing nests positioned at positions "1" and "3", as discussed above in conjunction with step 1106. In one embodiment, the substrates received from the incoming conveyor 111 are spaced a desired distance apart (i.e., distance between printing nests 131 positioned in positions "1" and "3") to allow the speed of all of the automation components to remain constant so that the substrates can be easily positioned in their respective printing nest at roughly the same time.

However, during steady state processing within system 100 a pair of substrates will have been processed in the screen print heads 102 prior to actuating the rotary actuator assembly 130 in step 1112, thus requiring the processed substrates to be removed from the printing nests 131 before the second pair of substrates can be loaded onto the printing nests 131. In one embodiment, the already processed pair of substrates are moved out of the printing nest 131 (i.e., transfer paths C4 and C5 in FIG. 10) and the second pair of substrates are transferred into the printing nests 131 (i.e., transfer paths C2 and C4) generally simultaneously. In this case the processed substrate positioned in position "1" needs to moved to the outgoing conveyor 112 by the motion of the material 137 in the printing nest 131 positioned in position "1", the belt 1011 in the central conveyor assembly 1010, and the material 137 in the printing nest 131 positioned in position "3", and the motion of the belt(s) 116 in the outgoing conveyor 112 by commands sent from the system controller 101. The processed substrate positioned in position "3" can be simultaneously moved to the outgoing conveyor 112 when the substrate in position "1" moved by use of the motion of the material 137 in the printing nest 131 positioned in position "3" and the motion of the belt(s) 116 in the outgoing conveyor 111 by commands sent from the system controller 101. In one embodiment, the movement of the already processed substrates from the rotary actuator assembly 130 and the movement of the new incoming substrates to the rotary actuator assembly 130 simultaneously occur in a serial fashion.

The processed substrates that were delivered to the outgoing conveyor 112 from the printing nests 131 can then be delivered to the each of the exit conveyors 114 following the transfer paths C5 (FIG. 11). In this configuration the system controller 101 is used to coordinate the motion of the belt(s) 116 and drive actuators (not shown) found in the outgoing conveyor 112 and exit conveyor 114 so that the substrates can be reliably transferred between these automation components. The exit conveyor 114 can then transfer the processed substrates to other parts of the production line following transfer path C6.

At step 1123, the second pair of substrates 150 may optionally be inspected by the components in the inspection assembly 200 to assure that there are no broken, chipped or cracked substrates positioned on the printing nests 131 and the precise position of the substrates on each of the printing nests 131 can be determined a similarly discussed in steps 508 and 1108, shown above.

At step 1126, shown in FIGS. 11 and 12, the rotary actuator assembly 130 is rotated so that each of the second pair of substrates are positioned within the screen print head 102 following transfer path C3 (FIG. 11) and the first pair of substrates are positioned at the rotary actuator positions "1" and "3" following transfer path C7 (FIG. 11). In one embodiment, as shown in FIG. 11, the rotary actuator assembly 130 is rotated about 90 degrees so that the substrates are positioned within the screen print head 102.

After step 1126 is completed then steps 1114 through 1126 can be repeated over and over again depending on how many substrates are to be processed in the system 1000. It should be noted that the number and sequence of steps illustrated in FIG. 12 is not intended to limit the scope of the invention described herein, since one or more steps can be deleted and/or reordered without deviating from the basic scope of the invention described herein. Also, the schematic representation of the steps shown in FIG. 12 is not intended to limit the scope of the invention described herein since as noted above the steps need not be completed in a sequential fashion as pictorially shown since one or more of the steps could be completed simultaneously.

While the foregoing is directed to embodiments of the present invention, other and further embodiments of the invention may be devised without departing from the basic scope thereof, and the scope thereof is determined by the claims that follow.

The invention claimed is:

1. An apparatus for depositing material on substrates, comprising:
 a rotary actuator having a rotational axis;
 a first substrate support and a second substrate support each coupled to the rotary actuator;
 a first conveyor positioned to transfer the substrates to the first substrate support when the rotary actuator is angularly positioned in a first orientation;
 a second conveyor positioned to receive the substrates from the first substrate support when the rotary actuator is angularly positioned in the first orientation;
 a third conveyor positioned to transfer the substrates to the second substrate support when the rotary actuator is angularly positioned in the first orientation; and
 a fourth conveyor positioned to receive the substrates from the second substrate support when the rotary actuator is angularly positioned in the first orientation, wherein each of the conveyors comprises an upper section supporting at least one belt and configured to extend and retract with respect to a lower section of the conveyor.

2. The apparatus of claim 1, further comprising:
 a third substrate support and a fourth substrate support each coupled to the rotary actuator;
 a first chamber positioned to receive the substrates on the third substrate support when the rotary actuator is angularly positioned in the first orientation and deposit a material thereon; and
 a second chamber positioned to receive the substrates on the fourth substrate support when the rotary actuator is angularly positioned in the first orientation and deposit a material thereon.

3. The apparatus of claim 2, further comprising an inspection system comprising:
 a first camera positioned to monitor the substrates disposed on the first substrate support when the rotary actuator is angularly positioned in the first orientation; and
 a second camera positioned to monitor the substrates disposed on the second substrate support when the rotary actuator is angularly positioned in the first orientation.

4. The apparatus of claim 1, wherein the first conveyor, the second conveyor, the third conveyor and the fourth conveyor are each aligned to transfer the substrates along a path that is parallel to a direction substantially tangent to an arc swept by the substrate supports when the rotary actuator is rotated about the rotational axis.

5. The apparatus of claim 4, further comprising:
an actuator that is adapted to transfer at least a portion of the first conveyor from a first location to a second location along a first direction substantially parallel to the first rotational axis; and
an actuator that is adapted to transfer at least a portion of the second conveyor from a first location to a second location along a second direction substantially parallel to the first rotational axis.

6. The apparatus of claim 4, wherein the first conveyor, the second conveyor, the third conveyor, and the fourth conveyor each comprises an actuator coupled to the at least one belt, wherein the actuator is adapted to position the belt using commands sent from a controller.

7. An apparatus for depositing material on substrates, comprising:
a rotary actuator having a rotational axis;
a first substrate support and a second substrate support each coupled to the rotary actuator;
a first conveyor comprising an upper section for supporting a belt member, wherein the upper section of the first conveyor is configured to move between a retracted position and an extended position, and wherein the upper section of the first conveyor is positioned to transfer the substrates to the first substrate support when the rotary actuator is angularly positioned in a first orientation and when the upper section of the first conveyor is positioned in the extended position; and
a second conveyor comprising an upper section for supporting a belt member, wherein the upper section of the second conveyor is configured to move between a retracted position and an extended position, and wherein the upper section of the second conveyor is positioned to transfer the substrates to the second substrate support when the rotary actuator is angularly positioned in the first orientation and the upper section of the second conveyor is positioned in the extended position.

8. The apparatus of claim 7, further comprising:
a third conveyor comprising an upper section for supporting a belt member, wherein the upper section of the third conveyor is configured to move between an extended position and a retracted position, and wherein the upper section of the third conveyor is positioned to receive the substrates from the first substrate support when the rotary actuator is angularly positioned in the first orientation and when the upper section of the third conveyor is positioned in the extended position; and
a fourth conveyor comprising an upper section for supporting a belt member, wherein the upper section of the fourth conveyor is configured to move between an extended position and a retracted position, and wherein the upper section of the fourth conveyor is positioned to receive the substrates from the second substrate support when the rotary actuator is angularly positioned in the first orientation and the upper section of the fourth conveyor is positioned in the extended position.

9. The apparatus of claim 7, further comprising:
a third substrate support and a fourth substrate support each coupled to the rotary actuator;
a first chamber positioned to receive the substrates on the third substrate support when the rotary actuator is angularly positioned in the first orientation and deposit a material thereon; and
a second chamber positioned to receive the substrates on the fourth substrate support when the rotary actuator is angularly positioned in the first orientation and deposit a material thereon.

10. The apparatus of claim 9, further comprising an inspection system, comprising:
a first camera positioned to monitor the substrates disposed on the first substrate support when the rotary actuator is angularly positioned in the first orientation; and
a second camera positioned to monitor the substrates disposed on the second substrate support when the rotary actuator is angularly positioned in the first orientation.

11. The apparatus of claim 7, wherein the first conveyor and the second conveyor are each aligned to transfer the substrates along a path that is generally parallel to a direction substantially tangent to an arc swept by the substrate supports when the rotary actuator is rotated about the rotational axis.

12. The apparatus of claim 11, wherein each of the first and second conveyors further comprises a lower section configured to guide the belt member, and wherein each upper and lower section is configured to move laterally with respect to one another.

13. The apparatus of claim 12, wherein each of the first and second conveyors further comprises a stationary pinion gear disposed between the upper and lower sections for laterally moving the upper and lower sections, a driver roller for moving the belt member, and an idler roller for tensioning the belt member.

14. An apparatus for depositing material on substrates, comprising:
a rotary actuator having a rotational axis;
a first substrate support and a second substrate support each coupled to the rotary actuator, wherein the first substrate support and the second substrate support are positioned on opposing sides of the rotary actuator;
a first conveyor positioned to transfer the substrates between the first and second substrate supports;
a second conveyor positioned to transfer the substrates to the first substrate support when the rotary actuator is angularly positioned in a first orientation; and
a third conveyor positioned to receive the substrates from the second substrate support when the rotary actuator is angularly positioned in the first orientation.

15. The apparatus of claim 14, further comprising
a third substrate support and a fourth substrate support each coupled to the rotary actuator, wherein the third substrate support and the fourth substrate support are positioned on opposing sides of the rotary actuator;
a first chamber positioned to receive the substrates on the third substrate support when the rotary actuator is angularly positioned in the first orientation and deposit a material thereon; and
a second chamber positioned to receive the substrates on the fourth substrate support when the rotary actuator is angularly positioned in the first orientation and deposit a material thereon.

16. The apparatus of claim 15, further comprising an inspection system comprising:
a first camera positioned to monitor the substrates disposed on the first substrate support when the rotary actuator is angularly positioned in the first orientation; and
a second camera positioned to monitor the substrates disposed on the second substrate support when the rotary actuator is angularly positioned in the first orientation.

17. The apparatus of claim 14, wherein the first conveyor, the second conveyor, and the third conveyor each comprises at least one belt and an actuator coupled to the at least one belt, wherein the actuator is adapted to position the belt using commands sent from a controller.

* * * * *